(12) United States Patent
Yang et al.

(10) Patent No.: US 8,734,664 B2
(45) Date of Patent: May 27, 2014

(54) METHOD OF DIFFERENTIAL COUNTER ELECTRODE TUNING IN AN RF PLASMA REACTOR

(71) Applicant: Applied Materials, Inc., Santa Clara, CA (US)

(72) Inventors: Yang Yang, Sunnyvale, CA (US); Kartik Ramaswamy, San Jose, CA (US); Kenneth S. Collins, San Jose, CA (US); Steven Lane, Porterville, CA (US); Douglas A. Buchberger, Jr., Livermore, CA (US); Lawrence Wong, Fremont, CA (US); Nipun Misra, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/958,898

(22) Filed: Aug. 5, 2013

(65) Prior Publication Data

US 2014/0034612 A1 Feb. 6, 2014

Related U.S. Application Data

(63) Continuation-in-part of application No. 12/178,032, filed on Jul. 23, 2008.

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC ............................................. 216/71; 216/67

(58) Field of Classification Search
CPC .................... H01J 37/32082; H01J 37/32174; H01J 37/32183; H01J 37/321; H03H 7/40
USPC ........................................................ 216/67, 71
See application file for complete search history.

(56) References Cited

U.S. PATENT DOCUMENTS

| 3,763,031 | A |   | 10/1973 | Scow et al. |
|---|---|---|---|---|
| 5,486,975 | A |   | 1/1996 | Shamouilian et al. |
| 5,668,524 | A |   | 9/1997 | Aida et al. |
| 6,016,131 | A | * | 1/2000 | Sato et al. ..................... 343/895 |
| 6,509,542 | B1 |   | 1/2003 | Benjamin et al. |

(Continued)

FOREIGN PATENT DOCUMENTS

| CN | 101057310 A | 10/2007 |
|---|---|---|
| JP | 08-167643 | 6/1996 |

(Continued)

OTHER PUBLICATIONS

U.S. Appl. No. 13/958,875, filed Aug. 5, 2012, Yang et al.

(Continued)

*Primary Examiner* — Roberts Culbert
(74) *Attorney, Agent, or Firm* — Robert M. Wallace

(57) ABSTRACT

A method of controlling distribution of a plasma parameter in a plasma reactor having an RF-driven electrode and two (or more) counter electrodes opposite the RF driven electrode and facing different portions of the process zones. The method includes providing two (or more) variable reactances connected between respective ones of the counter electrodes and ground, and governing the variable reactances to change distribution of a plasma parameter such as plasma ion density or ion energy.

19 Claims, 16 Drawing Sheets

(56) References Cited

U.S. PATENT DOCUMENTS

| | | |
|---|---|---|
| 7,189,432 B2 | 3/2007 | Chiang et al. |
| 7,837,828 B2 | 11/2010 | Ikeda et al. |
| 2003/0201069 A1 | 10/2003 | Johnson |
| 2004/0261946 A1 | 12/2004 | Endoh et al. |
| 2005/0103275 A1 | 5/2005 | Sasaki et al. |
| 2005/0272227 A1 | 12/2005 | Moriya et al. |
| 2007/0252529 A1 | 11/2007 | Belinger |
| 2007/0283891 A1 | 12/2007 | Okayama |
| 2009/0194023 A1 | 8/2009 | Tamura |
| 2009/0242135 A1 | 10/2009 | Koshimizu et al. |
| 2010/0018648 A1 | 1/2010 | Collins et al. |

FOREIGN PATENT DOCUMENTS

| | | |
|---|---|---|
| JP | 11144894 A | 5/1999 |
| JP | 2004-022822 A | 1/2004 |
| JP | 2007-266342 | 10/2007 |
| JP | 2008-053496 | 3/2008 |
| JP | 2008-117982 | 5/2008 |
| JP | 2009-187673 | 8/2009 |
| JP | 2009-231692 | 10/2009 |

OTHER PUBLICATIONS

U.S. Appl. No. 13/958,890, filed Aug. 5, 2013, Yang et al.

* cited by examiner of the plural counter electrodes facing the power applicator electrode near a first side of the plasma reactor chamber, the second plural counter electrodes facing the second power applicator electrode near a first side of the plasma reactor chamber, the second plural counter electrodes being coextensive with plural annular process zones, respectively, of the plasma reactor chamber, (c) providing second plural variable reactances connected between ground and respective ones of the second plural counter electrodes, and (d) controlling distribution of a second plasma parameter in a processing region of the plasma reactor chamber by separately controlling the second plural variable reactances.

METHOD OF DIFFERENTIAL COUNTER ELECTRODE TUNING IN AN RF PLASMA REACTOR

CROSS-REFERENCE TO RELATED APPLICATIONS

This application is a continuation-in-part of U.S. patent application Ser. No. 12/178,032, filed Jul. 23, 2008 entitled WORKPIECE SUPPORT FOR A PLASMA REACTOR WITH CONTROLLED APPORTIONMENT OF RF POWER TO A PROCESS KIT RING, by Kenneth S. Collins, et al., and assigned to the present assignee.

BACKGROUND

1. Technical Field

The disclosure concerns a plasma reactor for processing a workpiece such as a semiconductor wafer.

2. Background Discussion

The control of plasma processing uniformity in semiconductor fabrication is directly related to the performance of the fabrication equipment, such as a plasma reactor chamber. Recent developments in the semiconductor fabrication industry have imposed increased requirements on plasma processing uniformity control. For example, workpiece (wafer) size will increase from 300 mm to 450 mm in the foreseeable future, so that the wafer area that needs to be controlled is doubled. Also, plasma processing equipment tends to rely upon higher RF frequencies for better control of the radical and ion densities and, in some cases, to decouple the control of plasma ion and radical densities from the control of ion energies at the wafer surface. As both wafer size and excitation frequency increase, finite wavelength effects such as skin effect and standing wave effect severely affect the processing uniformity. There is also an electrostatic edge effect near the edge of the wafer which tends to increase or decrease the local processing rate. There are very few ways of electrically controlling plasma distribution or uniformity. Plasma distribution typically must be controlled by changing chamber parameters of the plasma reactor chamber, such as the ceiling-to-wafer gap, chamber pressure, gas flow rate and species of process gases, RF power level, or temperature. However, changes in such chamber parameters can negatively impact process results, or deviate from a desired process recipe while having only a limited impact upon plasma distribution or uniformity.

What is needed is a way of a strongly impacting plasma distribution without having to change chamber parameters, such as ceiling-to-wafer gap, chamber pressure, gas flow rate and species of feed stock gases, power or temperature, nor require the deviation of chamber parameters from values specified for them in a desired process recipe.

SUMMARY

A method is provided for controlling distribution of a plasma parameter in a plasma reactor. The method includes: (a) applying RF power to a power applicator electrode adjacent a first side of the plasma reactor chamber, (b) providing inner and outer counter electrodes facing the power applicator electrode near a second side of the plasma reactor chamber opposite the first side, the outer counter electrode having a radial extent exceeding that of the inner counter electrode, (c) providing a first variable reactance connected between the inner counter electrode and ground, and a second variable reactance connected between the outer counter electrode and ground, and (d) controlling distribution of the plasma parameter in a processing region of the plasma reactor chamber by separately controlling the first and second variable reactances. The plasma parameter may be plasma ion density or plasma ion energy, for example.

In one embodiment, the controlling distribution of a plasma parameter is preceded by setting chamber parameters in the plasma reactor chamber in accordance with a process recipe, the chamber parameters including at least one of chamber pressure, process gas flow rate, RF power level, ceiling-to-workpiece gap, workpiece temperature. In a related embodiment, the controlling distribution of a plasma parameter includes conforming the distribution to a predetermined distribution without changing the chamber parameters.

In one embodiment, the controlling distribution of a plasma parameter includes varying the second variable reactance until current flow to the outer counter electrode reaches a peak, and then varying the first variable reactance so as to more closely conform the distribution of the plasma parameter with a predetermined distribution.

In one embodiment, the method further includes coupling the inner counter electrode to the first variable reactance through an inner cylindrical conductor and coupling the outer counter electrode to the second variable reactance through an outer cylindrical conductor coaxial with the inner cylindrical conductor. In a related embodiment, the inner and outer cylindrical conductors are included within a coaxial conductor assembly, the method further including extending the coaxial conductor assembly through a containment element of the plasma reactor chamber. The containment element may be a ceiling or a floor of the plasma reactor chamber.

In another embodiment, a method of controlling distribution of a plasma parameter in a plasma reactor includes: (a) applying RF power to a power applicator electrode adjacent a first side of the plasma reactor chamber, (b) providing plural counter electrodes facing the power applicator electrode near a second side of the plasma reactor chamber opposite the first side, the plural counter electrodes being coextensive with plural annular process zones, respectively, of the plasma reactor chamber, (c) providing plural variable reactances connected between ground and respective ones of the plural counter electrodes, and (d) controlling distribution of the plasma parameter in the processing region of the plasma reactor chamber by separately controlling the plural variable reactances.

In a further aspect of this embodiment, the method further includes: (a) applying a second RF power to a second power applicator electrode adjacent the second side of the plasma reactor chamber, (b) providing a second plural counter electrodes facing the second power applicator electrode near the first side of the plasma reactor chamber, the second plural counter electrodes being coextensive with plural annular process zones, respectively, of the plasma reactor chamber, (c) providing second plural variable reactances connected between ground and respective ones of the second plural counter electrodes, and (d) controlling distribution of a second plasma parameter in a processing region of the plasma reactor chamber by separately controlling the second plural variable reactances.

In one embodiment, the RF power has a first frequency and the second RF power has a second frequency exceeding the first frequency, and wherein the plasma parameter includes plasma ion energy and the second plasma parameter includes plasma ion density. In a related embodiment, the second frequency is in a VHF range and the first frequency is below the VHF range.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
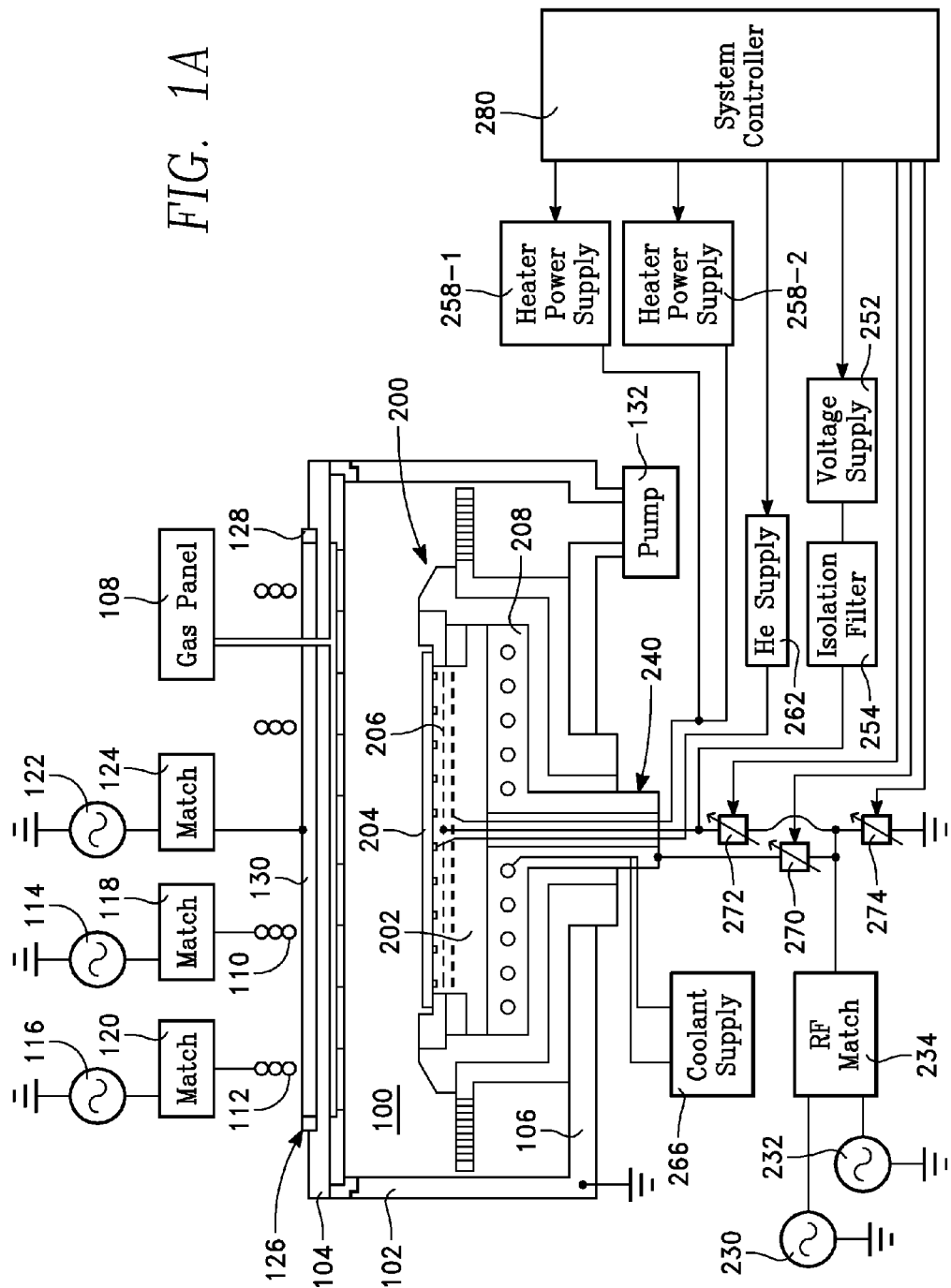
FIG. 1A depicts plasma reactor including a workpiece support pedestal in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1B:
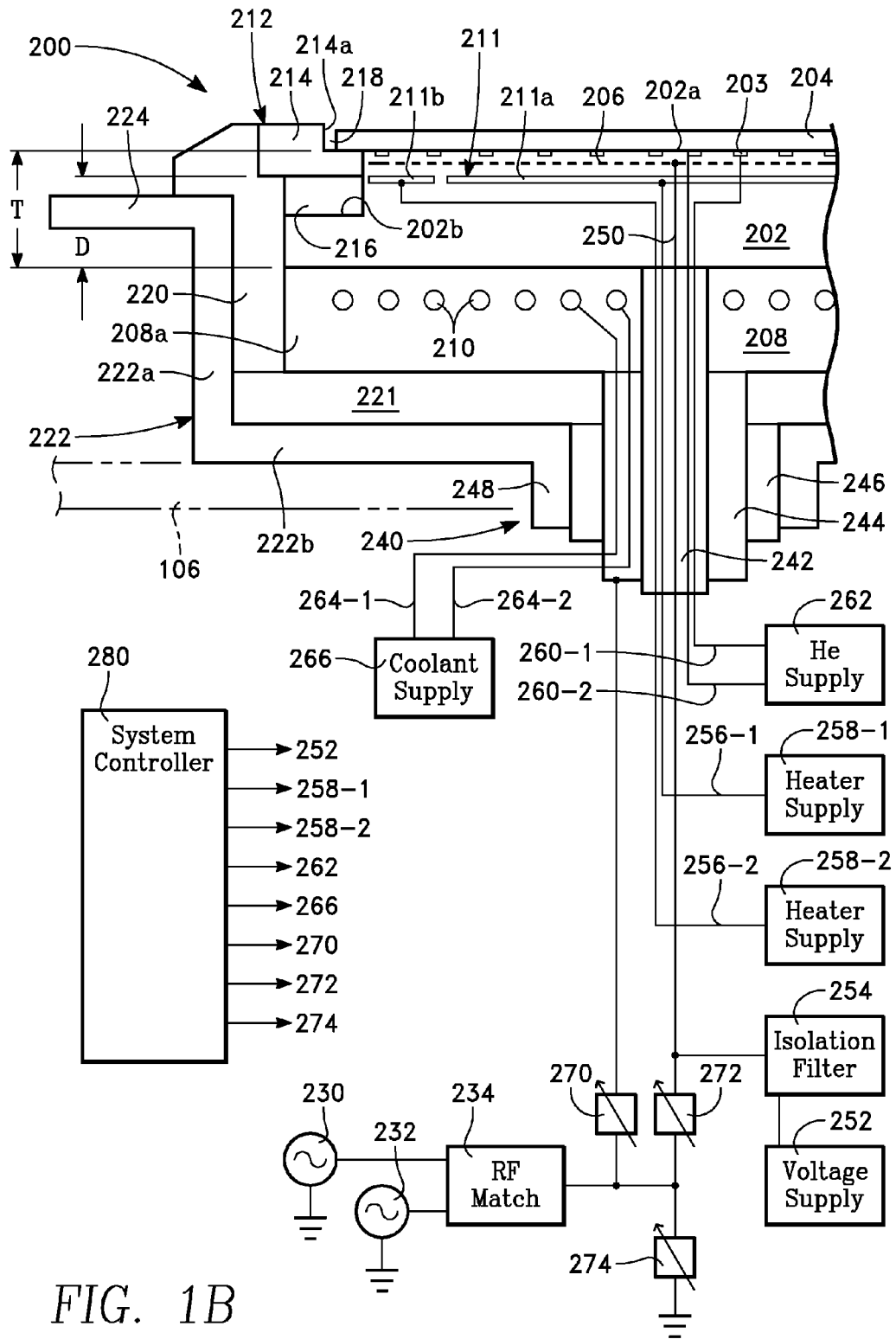
FIG. 1B is an enlarged view of a portion of FIG. 1A depicting certain details associated with the wafer support pedestal.

Referring to FIGS. 1A and 1B, a plasma reactor has a chamber 100 defined by a cylindrical sidewall 102, a ceiling 104 and a floor 106 whose peripheral edge meets the sidewall 102. The ceiling 104 may be a gas distribution plate that receives process gas from a process gas supply 108. The sidewall 102 and floor 106 may be formed of metal and connected to ground. A vacuum pump 132 evacuates the chamber 100 through a port in the floor 106. Plasma RF source power may be inductively coupled into the chamber 100 from respective inner and outer coil antennas 110, 112 that are connected to respective RF source power generators 114, 116 through respective RF impedance match elements 118, 120. The ceiling or gas distribution plate 104 may be formed of a non-conductive material in order to permit inductive coupling of RF power from the coil antennas 110, 112 through the ceiling 104 and into the chamber 100.

Alternatively, or in addition, RF plasma source power from an RF power generator 122 (which may be of a VHF frequency) and an impedance match 124 may be capacitively coupled into the chamber 100 from a ceiling electrode 126. The ceiling electrode 126 may be referred to as an overhead electrode. In one embodiment, the ceiling electrode 126 may be separate from the ceiling 104.

In one embodiment, RF power may be inductively coupled into the chamber 100 from the coil antennas 110, 112 through the ceiling 104 and through the ceiling electrode 126. In this embodiment, the gas distribution plate or ceiling 104 may be formed of a dielectric or semiconductive material while the ceiling electrode 126 may be in the form of a Faraday shield having an outer ring conductor 128 and plural conductive fingers 130 extending radially inwardly from the outer ring conductor 128. The ceiling electrode 126, if formed as a Faraday shield, may be connected to ground to provide a ground return for RF power coupled to a workpiece support pedestal to be described below. The ceiling electrode 126 may be grounded with respect to a selected frequency through an RF filter.

In the absence of the coil antennas 110, 112, the ceiling or gas distribution plate 104 may be formed completely of metal and serve as the ceiling electrode 126, being coupled to the RF power generator 122 through the impedance match 124.

A workpiece support pedestal 200 is provided inside the chamber 100 for holding a workpiece 204, such as a semiconductor wafer, mask, photomask, display panel, solar panel element, or the like. The pedestal 200 may be an electrostatic chuck (ESC) that electrostatically clamps or chucks the workpiece 204, and includes a dielectric top layer or puck 202 having a top surface 202a for supporting the workpiece 204. A conductive ESC grid 206 is embedded within the puck 202 within a small distance (e.g., 0.25 mm to 2 mm) of the puck top surface 202a. The ESC grid 206 serves as the ESC electrode to which a D.C. chucking voltage is applied in a manner described below. The puck 202 is supported on cathode 208 to which RF plasma bias power may be applied. The puck 202 may be formed of an insulating material (e.g., having a resistivity greater than $10^{12}$ Ohm·cm) or of a semiconducting material (e.g., having a resistivity between $10^8$ Ohm·cm and $10^{12}$ Ohm·cm).

Various features are provided for thermal control. An array of channels 203 are formed in the puck top surface 202a for supply of a thermally conductive gas (e.g., helium) to control thermal conductance between the workpiece 204 and the puck 202. These channels are completely enclosed whenever the workpiece 204 is clamped onto the puck top surface 202a. The cathode 208 contains internal fluid flow passages 210 through which a liquid coolant may be circulated. An electric heater 211 may be embedded within the puck 202. The heater 211 may be divided between separately controlled inner and outer heaters 211a and 211b, respectively.

A process kit ring assembly 212 surrounds the edge of the puck 202 and may include a process kit collar 214 overlying a process kit spacer ring 216 that rests in an annular shoulder 202b of the puck 202. A shoulder 214a of the process kit collar 214 surrounds the edge of the workpiece 204, leaving a small radial gap 218. An annular insulator 220 surrounds the process kit ring assembly 212, the puck 202 and the cathode 208. A disk-shaped cathode insulator 221 extending from the bottom edge of the annular insulator 220 underlies the cathode 208. An optional ground housing 222 has an outer annular portion 222a surrounding the annular insulator 220 and a disk shaped portion 222b underlying the cathode insulator 221. An optional annular ground baffle 224 extends from the outer annular portion 222a of the ground housing 222 to the chamber side wall 102.

RF bias power generators 230, 232 apply RF bias power to the cathode 208 through an RF bias impedance match circuit 234. The RF bias power generator 230 may have an HF frequency (e.g., below 27 MHz) or VHF frequency (e.g., greater than 27 MHz) while the RF bias power generator 232 may have an MF or LF frequency (e.g., below 4 MHz). The RF bias impedance match circuit 234 may be connected to the cathode 208 by a coaxial conductor assembly 240 extending from the cathode 208 through the chamber floor 106. The coaxial conductor assembly 240 has a center insulator 242, a hollow cylindrical cathode feed conductor 244 surrounding the center insulator 242 and a hollow cylindrical cathode feed insulator 246 surrounding the cathode feed conductor 244 and merging with the disk-shaped cathode insulator 221. The cylindrical cathode feed insulator 246 may be surrounded by an annular cathode ground return conductor 248 that extends from the cathode ground housing 222.

Utilities are coupled into the pedestal 200 by various conductors and conduits extending through the coaxial conductor assembly 240. A grid feed conductor 250 extends through the center insulator 242 to the ESC grid 206. An ESC voltage supply 252 furnishes a D.C. voltage to the ESC grid 206 through the grid feed conductor 250. An RF isolation filter 254 presents a high impedance to the RF voltage on the grid feed conductor and prevents RF power from reaching the D.C. supply. Heater supply conductor pairs 256-1, 256-2 extend through the center insulator 242 to the inner and outer heaters 211a, 211b. Independent AC power supplies 258-1, 258-2 are coupled to the inner and outer heaters 211a, 211b through the respective heater supply conductor pairs 256-1, 256-2. Gas feed conduits 260-1, 260-2 extend through the center insulator 242 to input and output ends (not shown) of the array of channels 203 in the puck surface 202a. A gas supply 262 containing a thermally conductive gas (e.g., helium) is coupled to the gas feed conduits 260-1, 260-2. Coolant feed conduits 264-1, 264-2 extend through the cylindrical cathode feed conductor 244 to input and output ports (not shown) of the internal fluid flow passages 210 in the cathode 208. A coolant supply 266 containing a liquid coolant is coupled to the coolant feed conduits 264-1, 264-2 for recirculation of a liquid coolant through the internal fluid flow passages 210. The coolant may be cooled or heated by an external heat exchanger.

The cathode 208 is coupled to the output of the RF bias impedance match circuit via the cathode feed conductor 244 through an optional cathode variable RF impedance element 270. The grid feed conductor 250, in addition to being coupled to the ESC voltage supply 252, is coupled to the output of the RF bias impedance match circuit 234 through a grid variable RF impedance element 272. In one embodiment, the cathode feed conductor 244 and the grid feed conductor 250 are coupled to RF ground through an optional cathode ground variable RF impedance element 274. In one embodiment, the cathode ground variable RF impedance element 274 is a band pass filter having a very narrow pass band centered at the frequency of the VHF power generator and blocking the frequencies of the RF bias power generators 230 and 232. This feature enables the pedestal 200 to act as an RF ground return electrode for VHF power capacitively coupled into the chamber 100 without shorting the bias power to ground.

A system controller 280 governs the variable impedances of the variable RF impedance elements 270, 272, 274, the pressure of the gas supply 262, the fluid temperature and flow rate of the coolant supply 266, the output currents of the AC heater supplies 258-1, 258-2 and the D.C. output voltage of the ESC voltage supply 252.

In the illustrated embodiment of FIGS. 1A and 1B, the entire ESC grid 206 underlies the workpiece 204, none of it underlying the process kit collar 214, so that any RF bias power applied to the ESC grid 206 is capacitively coupled to the workpiece 204, with comparatively little or no capacitive coupling to the process kit collar 214. An annular peripheral portion 208a of the cathode 208 extends beneath the process kit collar 214, so that a portion of RF bias power applied to the cathode is capacitively coupled to the process kit collar 214. This structure enables the RF bias power (or voltage or current) on the process kit collar 214 may be adjusted relative to the RF bias power (or current or voltage) on the workpiece 204 by applying different amounts of RF bias power to the ESC grid 206 and the cathode 208.

The cathode and grid variable RF impedance elements 270, 272 determine the apportionment of RF bias power (or current or voltage) between the cathode 208 and the ESC grid 206. For this purpose, only one of the two variable RF impedance elements 270, 272 is required (although the combination of both of them enhances the adjustment range). For example, if the cathode variable RF impedance element 270 is replaced by a direct electrical connection from the RF bias impedance match circuit 234 to the cathode feed conductor 244, then the impedance of the grid variable impedance element 272 by itself determines the apportionment of RF power between the cathode 208 and the ESC grid 206. This changes the apportionment of RF bias power between the workpiece 204 and the process kit collar 214. This is because, as described in the foregoing paragraph, the outer annulus 208a of the cathode 208 directly underlies the process kit collar 214, and capacitively couples RF bias power to the process kit collar 214, while the ESC grid 206 underlies the workpiece 204 and does not underlie the process kit collar 214, and capacitively couples nearly all of its RF bias power to the workpiece 204, not the process kit collar 214. When the grid variable RF impedance element 272 increases or decreases the proportion of RF power applied to the cathode, the RF power coupled to the process kit collar is increased or decreased, respectively, relative to the power coupled to the workpiece 204. How this apportionment of RF power operates will now be described.

The thickness T of the puck 202 and the distance D from the cathode 208 to the process kit collar 214 are selected to "over-compensate" the bias power density (or voltage or current) coupled to the plasma over the process-kit process kit collar relative to the bias power density coupled to the plasma over the central portion of the workpiece 204. This is done by designing the capacitance per unit area between the process kit collar 214 and the cathode 208 to be greater than the capacitance per unit area between the workpiece 204 and the cathode 208. If the process kit collar 214 is coupled to a larger plasma area than the RF coupled area between the cathode 208 and the process kit collar 214, or if the process kit collar 214 is loaded by additional capacitance to ground (for example in the radial outward direction), then the capacitance per unit area between process kit collar 214 and the cathode 208 may need to be even larger yet with respect to the capacitance per unit area between workpiece 204 and the cathode 208 to achieve the desired over-compensation.

The thickness of the process kit collar 214 can be selected to be "small" to keep cost of this consumable element low, typically about 1-4 mm. The thermal resistance of the Puck 202 increases with thickness, as does its cost, so the total thickness of the puck 202 is typically less than about 25 mm for a high thermal conductivity material such as aluminum nitride, or about 10 mm for a low thermal conductivity material such as aluminum oxide or yttrium oxide. For example, if the total puck thickness is selected to be 7 mm, a 2 mm thick process kit collar (214) of quartz, silicon or silicon carbide is selected. If semiconductor material (such as SiC or Si) is selected, then the process kit collar 214 may extend the effective area of the pedestal electrode beyond even the area of the cathode 208. In some cases, the process kit collar 214 may be Si or SiC while the process kit spacer ring 216 may be a material such as quartz when the reactor is employed to etch a Si-containing material. Besides extending the electrode effective area beyond the diameter of the cathode 208, the etch by-products may be more similar to those by-products from the workpiece being etched, thereby promoting etch uniformity to the edge by minimizing the local by-product change at workpiece edge. Other materials with a lower dielectric constant such as quartz may be used for process kit collar material, although the electrode effective area may be extended less beyond the cathode diameter than with a high dielectric constant material or a semiconductor. High dielectric constant material such as yttrium oxide may be used for the process kit spacer ring 216, for example, or for the process kit collar 214.

The grid variable RF impedance element 272 is recipe selectable via the system controller 280. In the case where a vacuum variable capacitor is used as the main element of the grid variable RF impedance element 272, a low minimum capacitance value diverts a minimum of RF current from the cathode 208 to the ESC grid 206. The process kit collar 214 in this case is still over-compensated relative to the apportionment of RF bias power (as discussed above). The grid variable RF impedance element 272 may be selected to a higher capacitance value to allow some current to bypass the relatively low capacitance of the pedestal structure between the cathode 208 and the workpiece 204. This decreases the over-compensation of the RF power coupled to the plasma via the process kit collar 214. A sufficiently high capacitance value in the grid variable RF impedance element 272 may be selected so that the effective capacitance per unit area between the process kit collar 214 and the cathode 208 is less than the effective capacitance per unit area between the workpiece 204 and the cathode 208 (taken in parallel with the selected capacitance of the variable impedance element and weighted by the same area). In such a case, the process kit power coupling will be under-compensated.

While the selection of different capacitance values of the grid variable RF impedance element 272 substantially changes the voltage on the cathode and the driving point input impedance of the cathode transmission line presented to the RF bias impedance match circuit 234, the RF bias impedance match circuit 234 compensates by changing the reactance of one of its internal elements (e.g., a series element), providing for substantially constant power coupled to the plasma. Thus, although variation of the capacitance of the grid variable RF impedance element 272 changes the power density (or voltage distribution or current density) apportionment between the plasma region adjacent the process kit collar 214 versus the plasma region adjacent the workpiece 204, the net power over the two regions remains substantially constant.

The adjustment or apportionment of relative bias RF power density (or voltage density or current density) between the workpiece and process kit regions (e.g., the over-compensation or under-compensation discussed above) may be used to tune workpiece structure or feature CD, profile angle (tilt), or etch rate, or etch selectivity to meet specific requirements. It may also be used to compensate for non-uniformities of plasma parameters (such as ion energy, ion angular energy distribution or ion density or flux) arising from inductively or capacitively coupled plasma source power, effects of D.C. magnetic confinement and so forth). Specifically, in the extreme edge region of the workpiece, the tilting of the RF electric field lines at the workpiece surface can be altered or corrected to avoid degradation of etch profile results, as manifested in etch profile tapering and etch profile twisting at the workpiece edge.

In a related approach, the material of the process kit collar 214 is selected to affect the chemical species content of the plasma near the workpiece edge. For example, the process kit collar material may react with the plasma to consume certain targeted species to improve process performance near the workpiece edge. Or, the process kit collar material may react with the plasma to generate more of a desired species near the workpiece edge to improve process performance. The system controller 280 may vary the RF bias power on the process kit collar 214 to control the participation rate of the process kit collar 214 with plasma, to obtain different participation rates as required for different process recipes or different phases of the same process recipe.

In a converse approach, the participation rate of the process kit collar 214 is controlled by regulating the temperature of the process kit collar, while apportionment of RF bias power to the process kit collar 214 is selected by the system controller 280 to make the plasma bias sheath electric field at the workpiece edge more uniform (i.e., conform with the sheath electric field over the main portion of the workpiece) for a given set of process conditions. This eliminates or minimizes non-uniformities at the workpiece edge, thereby obtaining better uniformity of ion velocity angular distribution (or other plasma performance parameters) across the workpiece surface up to and beyond the workpiece edge. The system controller 280 may be used to preserve electric field uniformity by adjusting the RF bias power coupled to the process kit collar 214 as different process conditions arise, such as changes in bias RF power level, source RF power level, D.C. magnetic field levels, and process gas composition, for example.

The adjustment or apportionment by the system controller 280 of the RF bias power coupled to the process kit collar 214 may also be used to enhance or reduce plasma reaction with the process kit collar for cleaning or surface conditioning of process kit collar 214.

Figure 2:
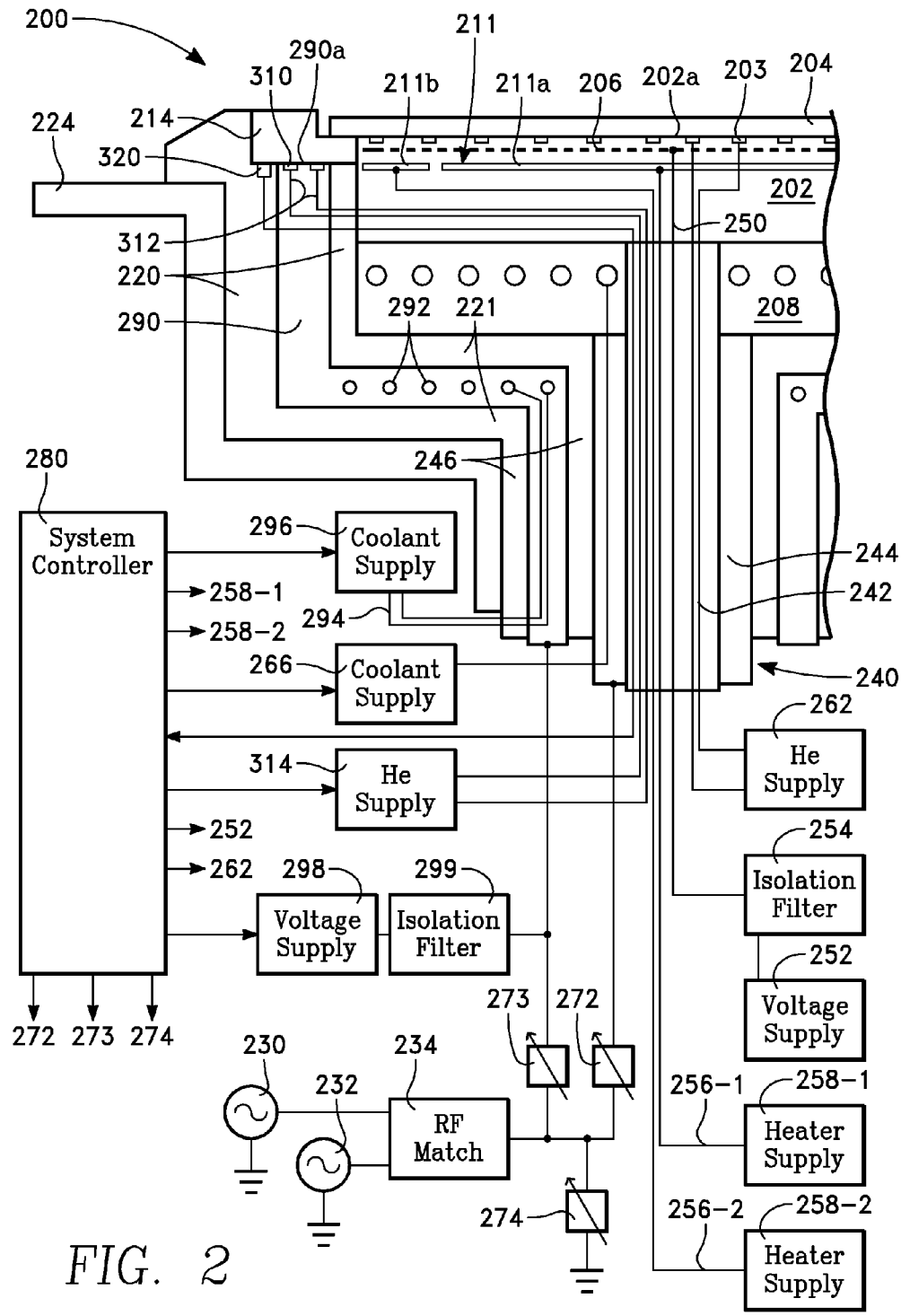
FIG. 2 depicts a workpiece support pedestal in accordance with a second embodiment.

FIG. 2 illustrates a modification of the embodiment of FIGS. 1A and 1B in which a process kit feed electrode 290 extends axially upward through the cathode feed insulator 246, disk-shaped cathode insulator 221 and the annular insulator 220. The process kit feed electrode 290 is cylindrical and provides RF electrical coupling to the process kit collar 214. In the implementation of FIG. 2, the optional process kit spacer ring 216 has been eliminated, although it may optionally be included in the embodiment of FIG. 2. In the embodiment of FIG. 2, the output of the RF bias impedance match circuit 234 is not connected to the grid feed conductor 250. Instead, the output of the bias RF match is coupled to the bottom end of the process kit feed electrode 290, as well as being coupled to the cathode feed conductor 244 through the grid variable RF impedance element 272. An optional process kit variable impedance element 273 operated by the system controller 280 may be interposed between the output of the RF bias impedance match circuit 234 and the process kit feed electrode 290. Only one of the two variable RF impedance elements 272, 273 of FIG. 2 are required. The presence of either one of the variable RF impedance elements 272, 273 enables the system controller 280 to control apportionment of RF bias power between the process kit (via the process kit feed electrode 290) and the workpiece (via the cathode 208). This apportionment operates in a manner similar to that described above with reference to the embodiment of FIGS. 1A and 1B.

As mentioned above in this specification, the apportionment of RF power to the process kit collar 214 may be used to optimize uniformity of the electric field across the workpiece surface up to and beyond the workpiece edge, while the participation rate of the selected material of the process kit collar 214 is controlled independently by controlling the temperature of the process kit collar 214. Independent temperature control of the process kit collar 214 may be realized by providing a set of separate internal coolant passages 292 within the process kit feed electrode 290. A set of coolant conduits 294 extending axially through the process kit feed electrode 290 couples the internal coolant passages 292 with a process kit coolant supply 296. The process kit collar 214 may be electrostatically clamped in place by applying a D.C. chucking voltage to the process kit feed electrode 290 from a process kit ESC voltage supply 298. An optional RF isolation filter 299 blocks RF current from reaching the process kit ESC voltage supply 298. Fine control of the process kit collar temperature may be realized by varying the output voltage of the process kit process kit ESC voltage supply 298, under control of the system controller 280. By varying the ESC clamping force between the process kit collar 214 and the process kit feed electrode 290, the thermal conductivity between them is varied and may be precisely controlled by the system controller 280 for fine control of the temperature of the process kit collar 214. Alternatively, or in addition, thermal control of the process kit collar 214 may be facilitated by providing gas channels 310 in the top surface 290a of the process kit feed electrode 290 underlying the process kit collar 214. Gas conduits 312 extending through the process kit feed electrode 290 provide for supply of a thermally conductive gas (e.g., helium) furnished from a gas supply 314. The gas pressure of the gas supply 314 is controlled by the system controller 280. The pressure within the channels 310 affects the electrode-to-process kit collar thermal conductivity and hence affects the temperature of the process kit collar 214. A temperature sensor 320 may be provided in a top surface of the annular insulator 220 and contact the process kit collar 214. The output of the temperature sensor 320 may be coupled to an input of the system controller 280, so that the system controller 280 can provide rapid precise closed loop temperature control of the process kit collar 214. Such closed loop temperature control can move the process kit collar 214 to different target temperatures required during different phases of a given process recipe, for example.

Figure 3:
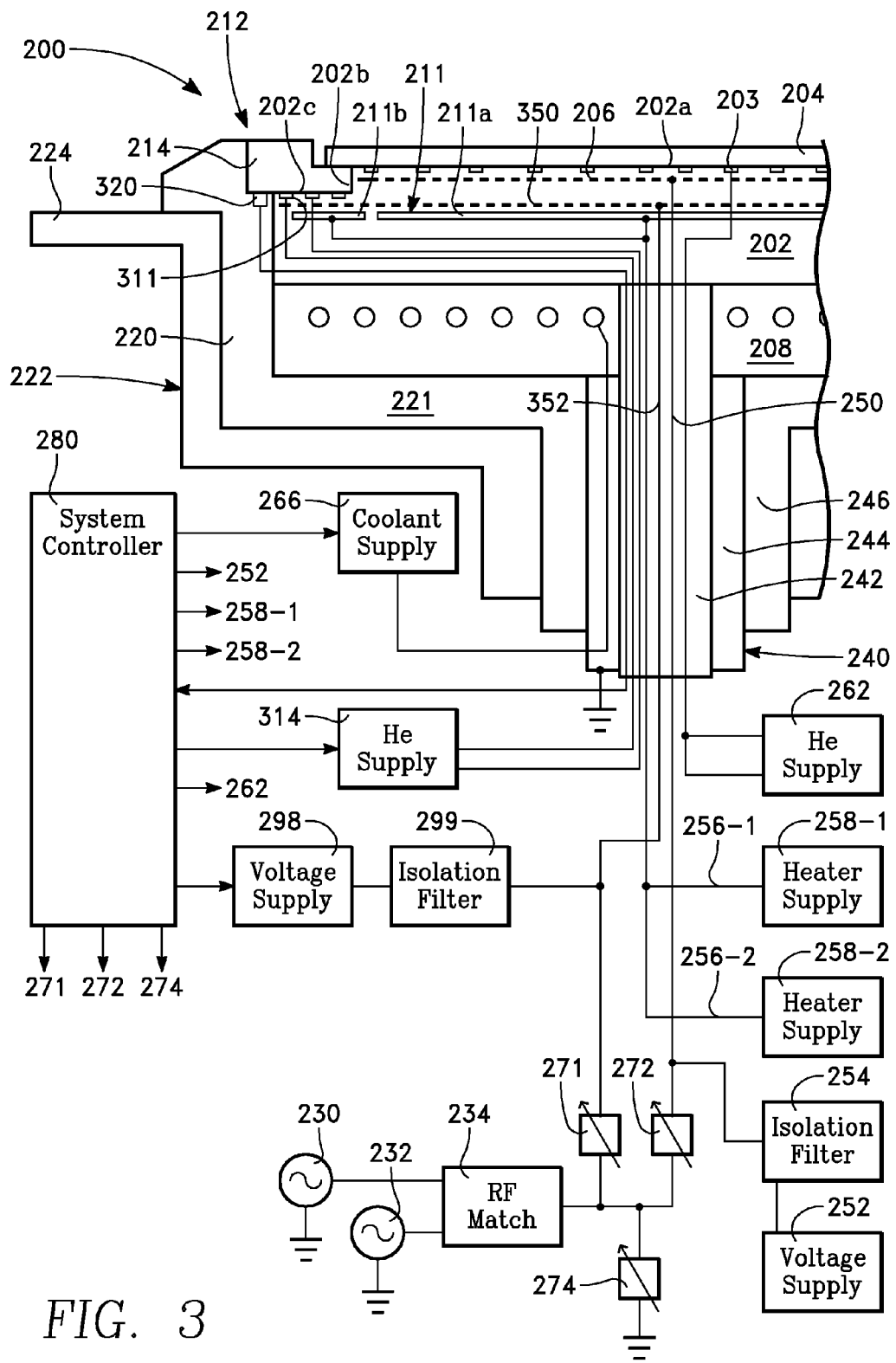
FIG. 3 depicts a workpiece support pedestal in accordance with a third embodiment.

FIG. 3 depicts another modification of the embodiment of FIGS. 1A and 1B, in which the cathode 208 is grounded, rather than being driven by RF bias power. Instead, RF bias power is applied to a process kit grid 350 underlying the process kit ring assembly 212 and embedded inside the puck 202. The process kit grid 350 is placed at a level within the puck 202 that is below the level of the ESC grid 206. The process kit grid 350—or at least an outer annular portion thereof—underlies the process kit collar 214 and therefore can capacitively couple RF power to the process kit collar 214. The ESC grid 206 completely underlies the workpiece 204 so that substantially all RF power applied to the ESC grid 206 is capacitively coupled to the workpiece 204. The two grids 206, 350 are electrically insulated from one another, and therefore provide a way of adjusting the different levels of RF power coupled to the workpiece 204 and the process kit collar 214.

A process kit grid RF feed conductor 352 extends through the center insulator 242 and through the puck 202 so that its top end contacts the process kit grid 350. The bottom end of the process kit grid RF feed conductor 352 is coupled to the output of the RF bias impedance match circuit 234. An optional process kit grid variable RF impedance element 271 may be interposed between the output of the RF bias impedance match circuit 234 and the process kit grid feed conductor 352. Only one of the two variable RF impedance elements 271, 272 of FIG. 3 is required to apportion RF bias power between the two grids 206, 350, although the combination of both of them affords a greater range of adjustment.

The embodiment of FIG. 3 may further include the same type of elements for controlling the temperature of the process kit collar 214. Specifically, a thermally conductive gas may be circulated beneath the process kit collar 214, and the process kit collar 214 may be electrostatically clamped to the puck 202 with a force that is variable to vary or control thermal conductivity at the process kit collar-puck interface, for temperature control of the process kit collar 214. The shoulder 202b of the puck 202 defines an outer annular puck surface 202c on which the process kit collar 214 rests. Gas flow channels 311 are formed in the outer annular puck surface 202c for thermally conductive gas (e.g., Helium) circulation. The gas flow channels 311 are completely enclosed when the process kit collar 214 is clamped to the outer annular puck surface 202c. The process kit collar 214 is electrostatically clamped or chucked to the outer annular puck surface 202c by the process kit ESC voltage supply 298 whose output is coupled to the process kit grid feed conductor 352 in the embodiment of FIG. 3. The optional RF isolation filter 299 may be interposed between the process kit ESC voltage supply 298 and the process kit grid feed conductor 352. Fine control of the temperature of the process kit collar 214 may be realized by the system controller 280 varying the output voltage of the process kit ESC voltage supply 298, which varies the process kit collar-to-puck thermal conductivity by varying the electrostatic clamping force on the process kit collar 214.

Figure 4:
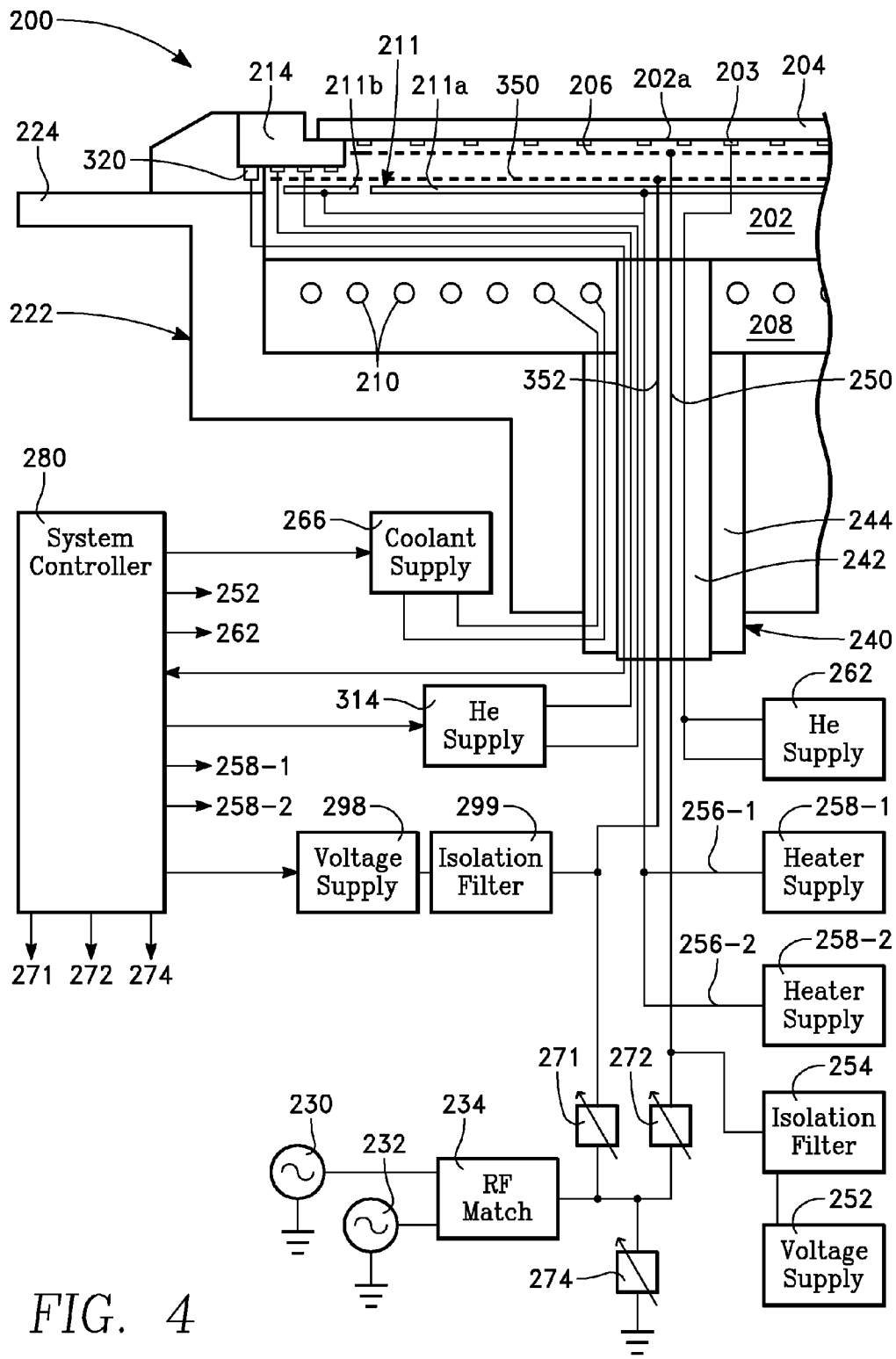
FIG. 4 depicts a workpiece support pedestal in accordance with a fourth embodiment.

The embodiment of FIG. 3 may be modified by eliminating the cathode insulator 221 so that the cathode 208 is grounded to the cathode ground housing 222, as depicted in FIG. 4.

Figure 5:
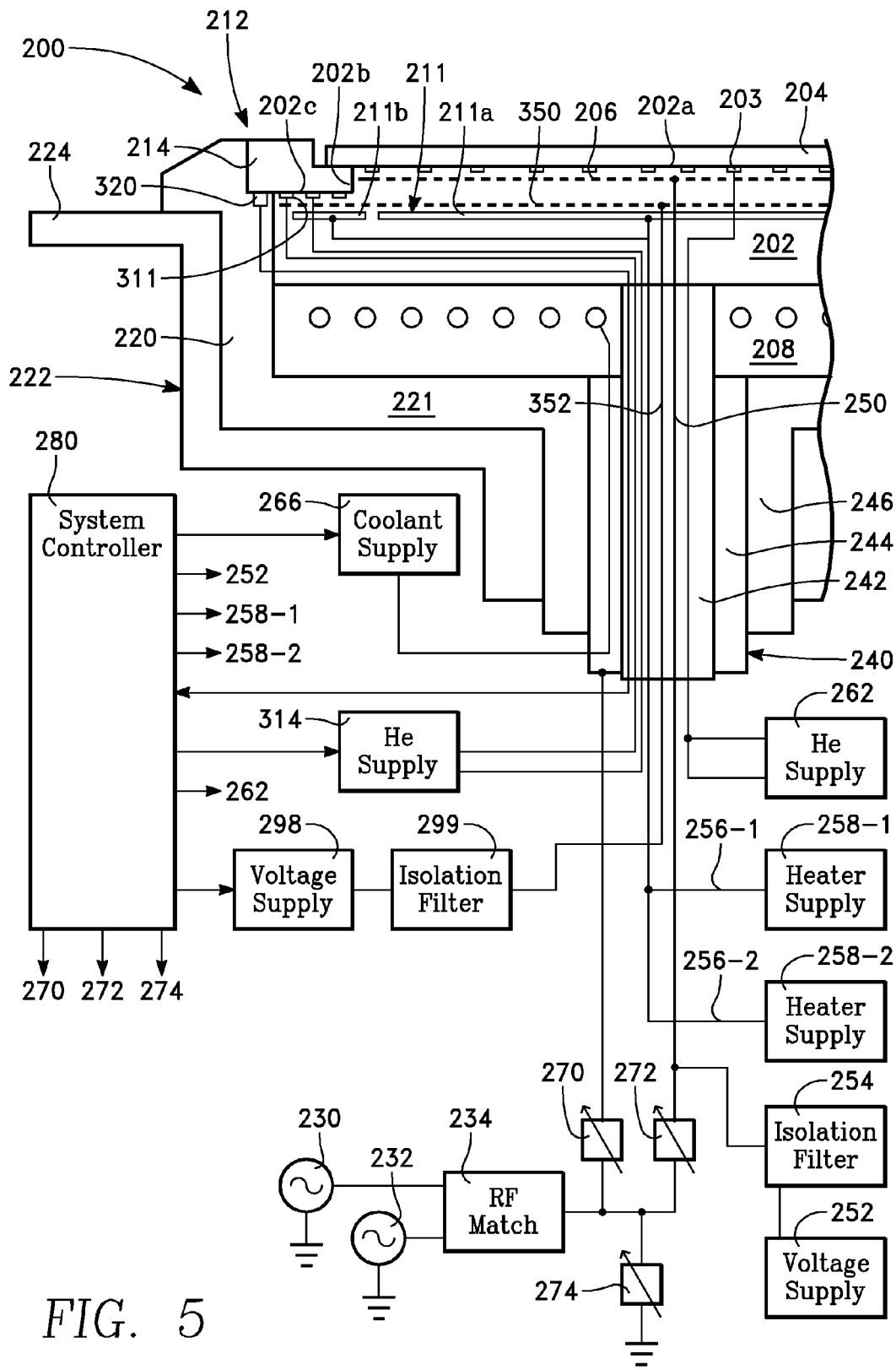
FIG. 5 depicts a modification of the embodiment of FIG. 1B in which features for thermally controlling a process kit collar are included.

The features described above with reference to FIG. 3 for thermally controlling the process kit collar 214 may be incorporated into the embodiment of FIG. 1B and operate in the manner described above with reference to FIG. 3. Such an enhancement of the embodiment of FIG. 1B is depicted in FIG. 5. The embodiment of FIG. 5 is the same as that of FIG. 1B except that certain thermal control features, described above with reference to FIG. 3, have been added. In FIG. 5, the process kit spacer ring a has been eliminated (although in other implementations it may be retained), so that the puck 202 may extend beneath the process kit collar 214, as shown in FIG. 5. A shoulder 202b in the puck 202 defines an outer annular puck surface 202c underlying and contacting the bottom surface of the process kit collar 214. Gas flow channels 311 are formed in the outer annular puck surface 202c and coupled to a gas supply containing a thermally conductive gas (e.g., helium). The outer heater 211*b* is located directly beneath the process kit collar 214, as depicted in FIG. 5. A temperature sensor 320 adjacent the process kit collar 214 is coupled to the system controller 280. Optionally, a process kit grid 350 may be embedded in the puck 202 beneath the process kit collar 214 and employed to electrostatically clamp or chuck the process kit collar 214 onto the outer annular puck surface 202*c*. In the embodiment of FIG. 5, the process kit grid 350 is coupled to a process kit ESC voltage supply 298 through an RF isolation filter 299. The voltage of the process kit ESC voltage supply 298 is controlled by the system controller 280 to vary the clamping force on the process kit collar 214, and thereby vary the process kit collar temperature.

Figure 6:
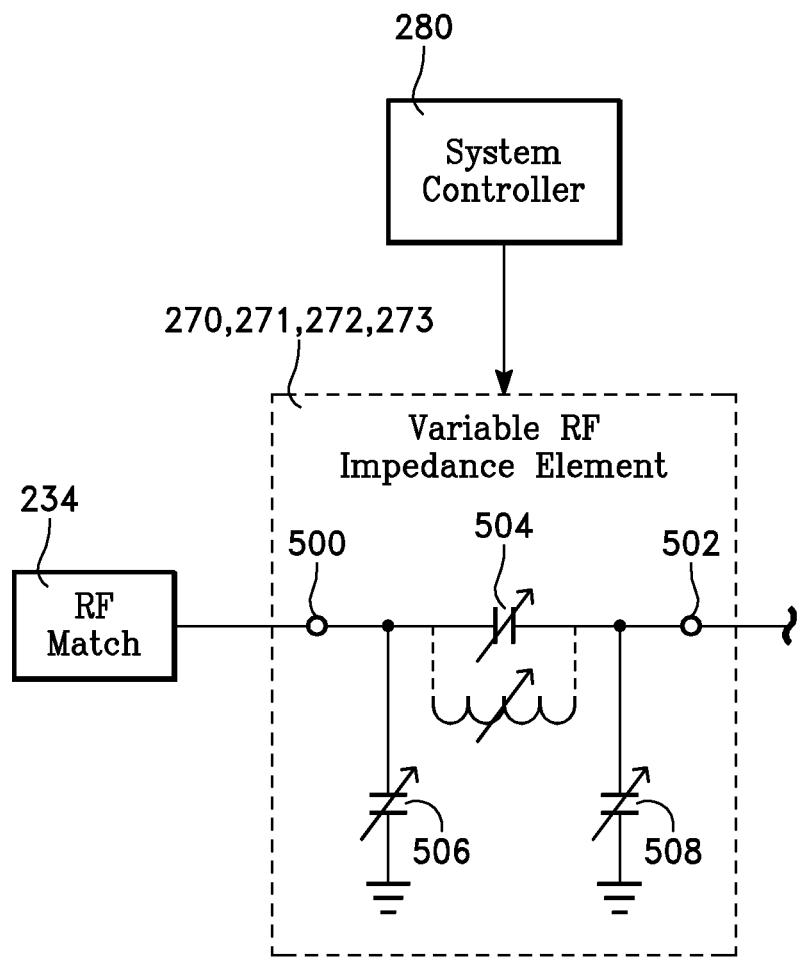
FIG. 6 is a simplified schematic diagram of a circuit that can be employed as one of the variable impedance elements used to apportion RF power between the process kit and the workpiece in the embodiments of FIGS. 1-4.

The variable RF impedance elements 270, 271, 272, 273 described above with reference to the embodiments of FIGS. 1-5 are employed for apportioning RF bias power between the process kit and the workpiece. While any suitable variable reactance circuit may be used to implement each of the variable RF impedance elements 270, 271, 272, 273, FIG. 6 is a simplified schematic diagram of one example of an implementation of one of the variable RF impedance elements 270, 271, 272 or 273. The variable RF impedance element of FIG. 6 consists of an input terminal 500 that is coupled to the output of the RF bias impedance match circuit 234 and an output terminal 502. A series variable capacitor 504 is connected between the input and output terminals 500 and 502. Optionally an input parallel capacitor 506 is connected between the input terminal 500 and RF ground and an output parallel capacitor 508 is connected between the output terminal 502 and RF ground. All or any one of the capacitors 504, 506, 508 may be a variable capacitor. In an alternative embodiment, any one of the capacitors 504, 506, 508 may be replaced by a suitable inductor that may be variable.

Differential Counter Electrode Tuning

The present invention concerns controlling distribution within a plasma reactor chamber of plasma ion density or energy (or another plasma parameter) by a novel approach which is defined herein as differential counter electrode tuning. In differential counter electrode tuning, RF power coupled from an RF-driven electrode is returned to ground through two (or more) counter electrodes through respective variable reactances directly to RF ground. Generally, the counter electrodes are separate from the side wall of the plasma reactor chamber. However, in one embodiment it is possible to employ the side wall as an additional counter electrode by controlling its RF impedance to ground. The counter electrodes differ from one another in their spatial distribution. For example, one counter electrode may couple more power to a radially inner portion of a processing zone over a workpiece surface, while the other counter electrode may couple more power to a radially outer portion of the processing zone. In the illustrated embodiments described below, the driven electrode and the counter electrodes have planar areas, and the planar areas the counter electrodes are facing and parallel to the area or surface of the driven electrode.

Figure 7:
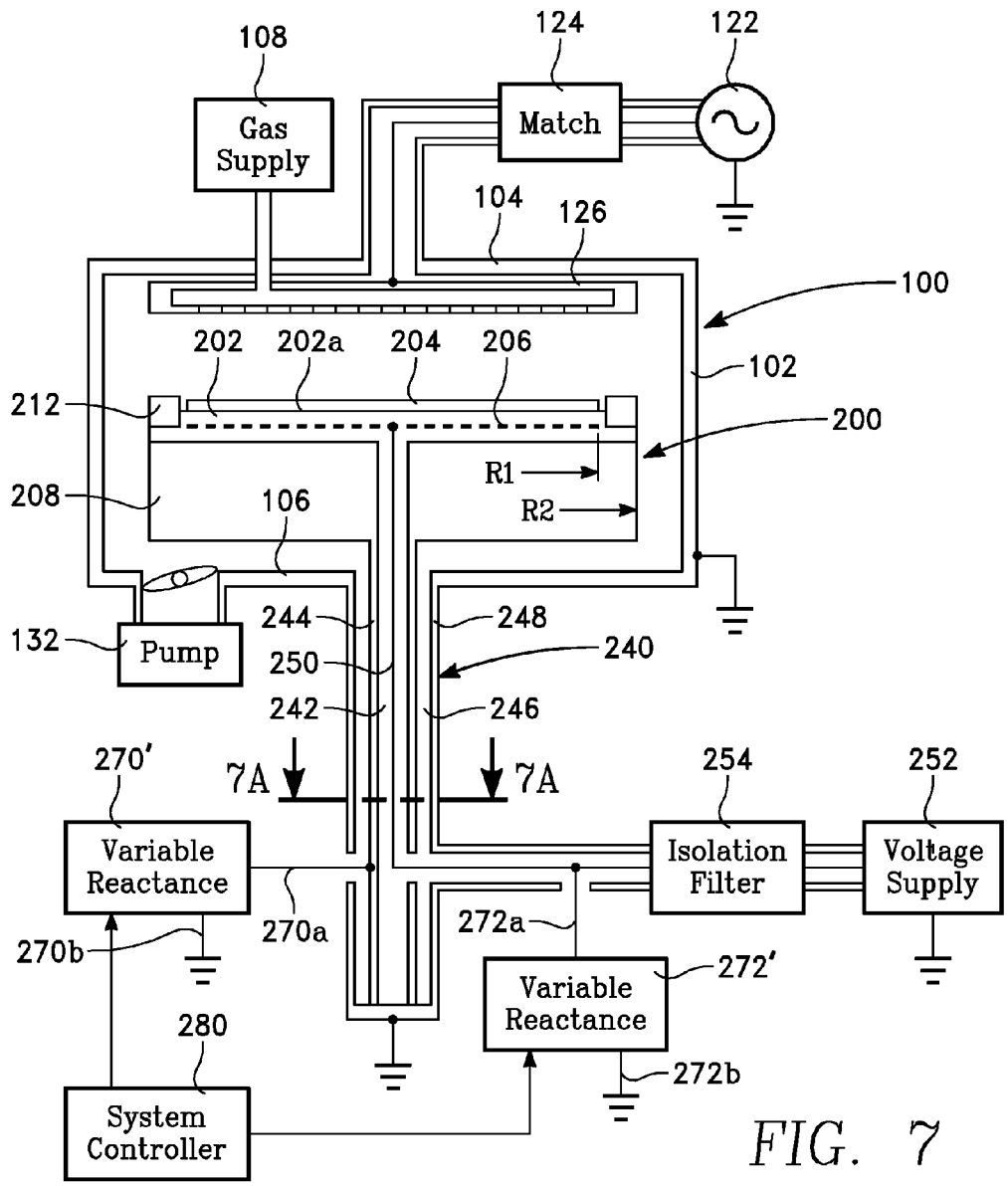
FIG. 7 is a simplified diagram of one embodiment of the present invention.
Figure 7A:
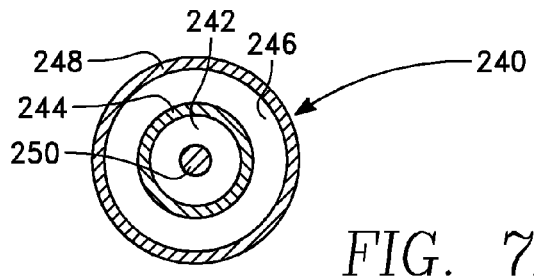
FIG. 7A is a cross-sectional view taken along lines 7A-7A of FIG. 7.

Referring now to FIGS. 7 and 7A, a plasma reactor chamber has some of the same structural features as the plasma reactor chamber 100 of FIGS. 1A and 1B. These features include the cylindrical sidewall 102, the ceiling or gas distribution plate 104 which may be a part of or serve as the ceiling electrode 126 (the driven electrode), the floor 106, the vacuum pump 132, the RF power generator 122 and the impedance match 124 connected to the ceiling electrode 126. In one embodiment, the side wall 102 is grounded. The reactor chamber of FIG. 7 further includes the workpiece support pedestal 200 including a dielectric top layer or puck 202 having a top surface 202*a* for supporting the workpiece 204, the ESC grid 206 embedded within the puck 202, and the cathode 208.

In one embodiment, the process kit ring assembly 212 surrounds the edge of the puck 202.

In the embodiment depicted in FIG. 7, a coaxial conductor assembly 240 extends from the cathode 208 through the chamber floor 106. The coaxial conductor assembly 240 has a center insulator 242, a hollow cylindrical cathode feed conductor 244 surrounding the center insulator 242, and a hollow cylindrical cathode feed insulator 246 surrounding the cathode feed conductor 244. The cylindrical cathode feed insulator 246 may be surrounded by an annular cathode ground return conductor 248. A grid feed conductor 250 extends through the center insulator 242 to the ESC grid 206. The reactor of FIG. 7 further includes the ESC voltage supply 252 and the RF isolation filter 254.

In one embodiment, the conductors of the coaxial conductor assembly 240 extend below the chamber floor 106 and are mutually coaxial (as depicted in FIG. 7A) and return RF power to ground in a symmetrical manner with respect to the cylindrical axis of symmetry of the reactor chamber 100. This cylindrical symmetry minimizes skew (azimuthal non-uniformity) in distribution of a plasma parameter (such as plasma ion density or plasma ion energy) across the surface of the workpiece 204.

A first variable reactance 270' has one port 270*a* connected to the bottom end of the cathode feed conductor 244 of the coaxial conductor assembly 240 and an opposite port 270*b* connected directly to ground. (The term "bottom end" as employed herein refers to an end below the floor 106.) A second variable reactance 272' has one port 272*a* connected to the bottom end of the grid feed conductor 250 of the coaxial conductor assembly 240 and an opposite port 272*b* connected directly to ground. The system controller 280 governs the reactances of the variable reactances 270' and 272' and can operate them independently. The bottom end of the cathode feed conductor 244 may be grounded as depicted in FIG. 7, or (optionally) not connected to ground.

The ESC grid 206 and the cathode 208 function as ground return electrodes (counter electrodes) for RF power coupled into the chamber 100 from the ceiling electrode 126. As counter electrodes, the ESC grid 206 and the cathode 208 have major surfaces facing and parallel with the ceiling electrode 126, in the illustrated embodiment. The ESC grid 206 has a smaller radius R1 while the cathode 208 has a greater radius R2, so that the cathode 208 has a greater influence over RF electrical fields in an outer radial zone (e.g., from R1 to R2) while the ESC grid 206 has a greater influence over RF electrical fields in an inner radial zone (e.g., within R1). By controlling the two variable reactances 270' and 272' differently, the difference or ratio between RF current, voltage or power in the inner and outer zones is controlled to govern radial distribution of a plasma parameter, such as plasma ion density or plasma ion energy, for example. One advantage is that this control can be exercised independently of chamber parameters such as chamber pressure, workpiece temperature, RF power levels, process gas flow distribution, process gas species, workpiece-to-ceiling gap, or the like. In one embodiment, the chamber parameters are set in accordance with a predetermined process recipe, and left unchanged while the radial distribution of a plasma parameter (such as plasma ion density or plasma ion energy) is adjusted or conformed to a desired distribution by varying the variable reactances 270' and 272'. For example, the system controller 280 may set the chamber parameters such as chamber pressure, workpiece temperature, RF power levels, process gas flow distribution, process gas species, workpiece-to-ceiling gap, by fixing them to respective values specified in a process recipe. Then, without having to change any of the chamber parameter settings, the controller varies the variable reactances until the distribution of a plasma parameter (e.g., plasma ion density) reaches a desired distribution. The desired distribution may be a uniform distribution, for example.

Each of the variable reactances 270' and 272' may include one or more variable reactance elements, such as a variable capacitor, a variable inductor, a variable RF tuning stub, and the like, or combinations thereof. Such variable reactances are described below with reference to FIGS. 14A through 14D.

One method of operating the embodiment of FIG. 7 is as follows: The variable reactance 270' that is connected to the cathode 208 is varied until RF current flow through the cathode 208 is reaches or at least nearly reaches a peak or maximum. Then, the variable reactance 272' that is connected to the ESC grid 206 is varied so as to conform the radial distribution of a plasma parameter, such as plasma ion density or plasma ion energy, to a desired distribution. In one example, the desired radial distribution was uniform. We have found that, applying this method to the case in which the RF power generator a has a VHF frequency (e.g., above 30 MHz), the radial distribution of plasma ion density is highly responsive to changes in the variable reactance 272'.

Figure 8:
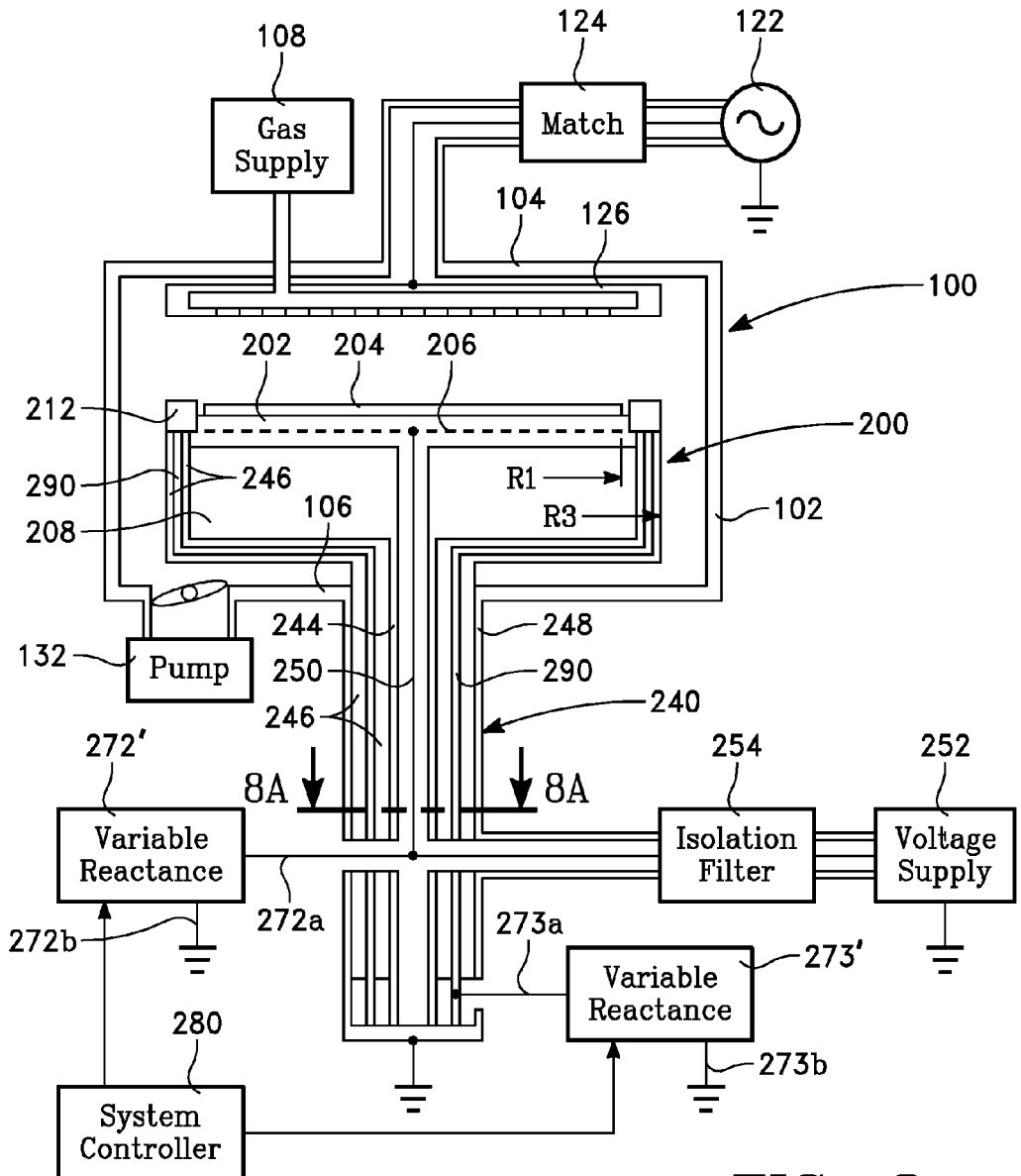
FIG. 8 is a simplified diagram of an other embodiment of the present invention.
Figure 8A:
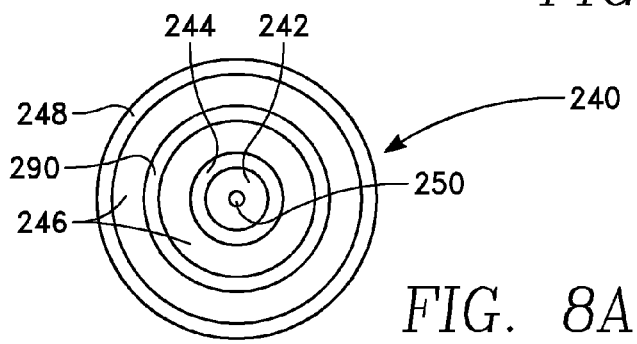
FIG. 8A is a cross-sectional view taken along lines 8A-8A of FIG. 8.

FIGS. 8 and 8A illustrate a modification of the embodiment of FIG. 7 in which a process kit feed electrode 290 is included in the coaxial conductor assembly 240, and is coaxial with the other elements of the coaxial conductor assembly 240 such as the grid feed conductor 250. The process kit feed electrode 290 provides RF electrical coupling to the process kit ring assembly 212. In one implementation, the process kit feed electrode 290 extends through the cathode feed insulator 246, as depicted in FIG. 8. In the embodiment of FIG. 8, the process kit ring assembly 212 functions as the outer electrode providing an outer RF return path to ground through a variable reactance, as will be described. The inner electrode providing an inner RF return path to ground may be the ESC grid 206, as described in detail below. However, in an alternative embodiment, the cathode 208 may be used as the inner electrode providing an inner RF return path through a variable reactance. The remainder of the description of FIG. 8 is directed to the embodiment in which the ESC grid 206 serves as the inner electrode.

The variable reactance 272' has one port 272a connected to the bottom end of the grid feed conductor 250 of the coaxial conductor assembly 240 and its opposite port 272b connected directly to ground. Another variable reactance 273' has one port 273a connected to the bottom end of the process kit feed electrode 290 of the coaxial conductor assembly 240 and an opposite port 273b connected directly to ground. The system controller 280 governs the reactances of the variable reactances 272' and 273' and may control these variable reactances separately.

The ESC grid 206 and the process kit ring assembly 212 function as ground return electrodes (counter electrodes) for RF power coupled into the chamber 100 from the ceiling electrode 126. The ESC grid 206 has a smaller radius R1 while the process kit ring assembly 212 has a greater radius R3, so that the process kit ring assembly 212 has a greater influence in an outer radial zone (e.g., from R1 to R3) while the ESC grid 206 has a greater influence in an inner radial zone (e.g., within R1). By controlling the two variable reactances 272' and 273' differently, the difference or ratio between RF currents (or voltages or power levels) in the inner and outer zones is controlled to govern radial distribution of a plasma parameter, such as plasma ion density or plasma ion energy, for example. One advantage is that this control can be exercised independently of chamber parameters such as pressure, temperature, RF power levels, process gas flow distribution, process gas species or the like. In one embodiment, the chamber parameters are set in accordance with a predetermined process recipe, and then the radial distribution of a plasma parameter (such as plasma ion density or plasma ion energy) is adjusted or conformed to a desired distribution by varying the variable reactances 272' and 273'.

In FIG. 8, the conductors of the coaxial conductor assembly 240 (e.g., the grid feed conductor 250 and the process kit feed electrode 290) are mutually coaxial and return RF power to ground in a symmetrical manner with respect to the cylindrical axis of symmetry of the reactor chamber 100. This cylindrical symmetry minimizes skew (azimuthal non-uniformity) in distribution of a plasma parameter (such as plasma ion density or plasma ion energy) across the surface of the workpiece 204.

Figure 9:
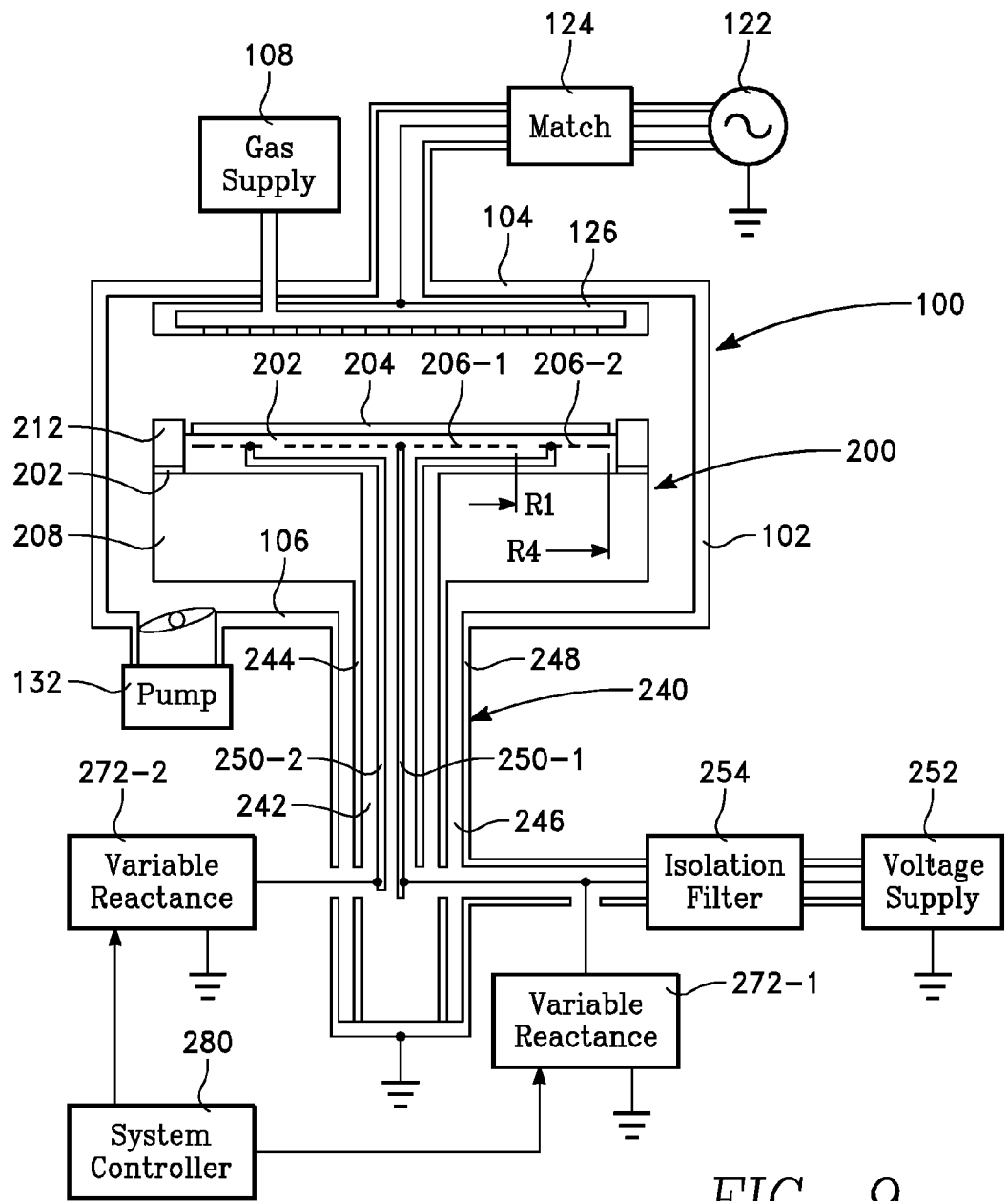
FIG. 9 is a simplified diagram of a further embodiment of the present invention.

FIG. 9 depicts a modification in which the ESC grid 206 is divided into radially inner and outer grids 206-1 and 206-2 electrically insulated or separate from one another. In one embodiment the inner grid 206-1 may be disk-shaped while the outer grid 206-2 is annular. Concentric inner and outer grid feed conductors 250-1 and 250-2 in the coaxial conductor assembly 240 extend from respective ones of the inner and outer grids 206-1 and 206-2 through the floor 106. In the illustrated embodiment, the outer grid feed conductor 250-2 is a hollow cylinder surrounding and coaxial with the inner grid feed conductor 250-1. The coaxial relationship of the inner and outer feed conductors 250-1, 250-2 provides the cylindrical symmetry in RF current distribution that minimizes skew in process results, discussed above with respect to FIGS. 7 and 8.

A variable reactance 272-1 has one port connected to the bottom end of the inner grid feed conductor 250-1 and an opposite port connected directly to ground. Another variable reactance 272-2 has one port connected to the bottom end of the outer grid feed conductor 250-2 and an opposite port connected directly to ground. The system controller 280 governs the reactances of the variable reactances 272-1 and 272-2.

The inner and outer grids 206-1 and 206-2 function as ground return electrodes (counter electrodes) for RF power coupled into the chamber 100 from the ceiling electrode 126. The inner grid 206-1 has a smaller radius R1 while the outer grid 206-2 has a greater radius R4, so that the outer grid 206-2 has a greater influence in an outer radial zone (e.g., from R1 to R4) while the inner grid 206-1 has a greater influence in an inner radial zone (e.g., within R1). By controlling the two variable reactances 272-1 and 272-2 differently, the difference or ratio between RF currents (or voltages or power levels) in the inner and outer zones is controlled to govern radial distribution of a plasma parameter, such as plasma ion density or plasma ion energy, for example. One advantage is that this control can be exercised independently of chamber parameters such as pressure, temperature, RF power levels, process gas flow distribution, process gas species or the like.

Figure 10:
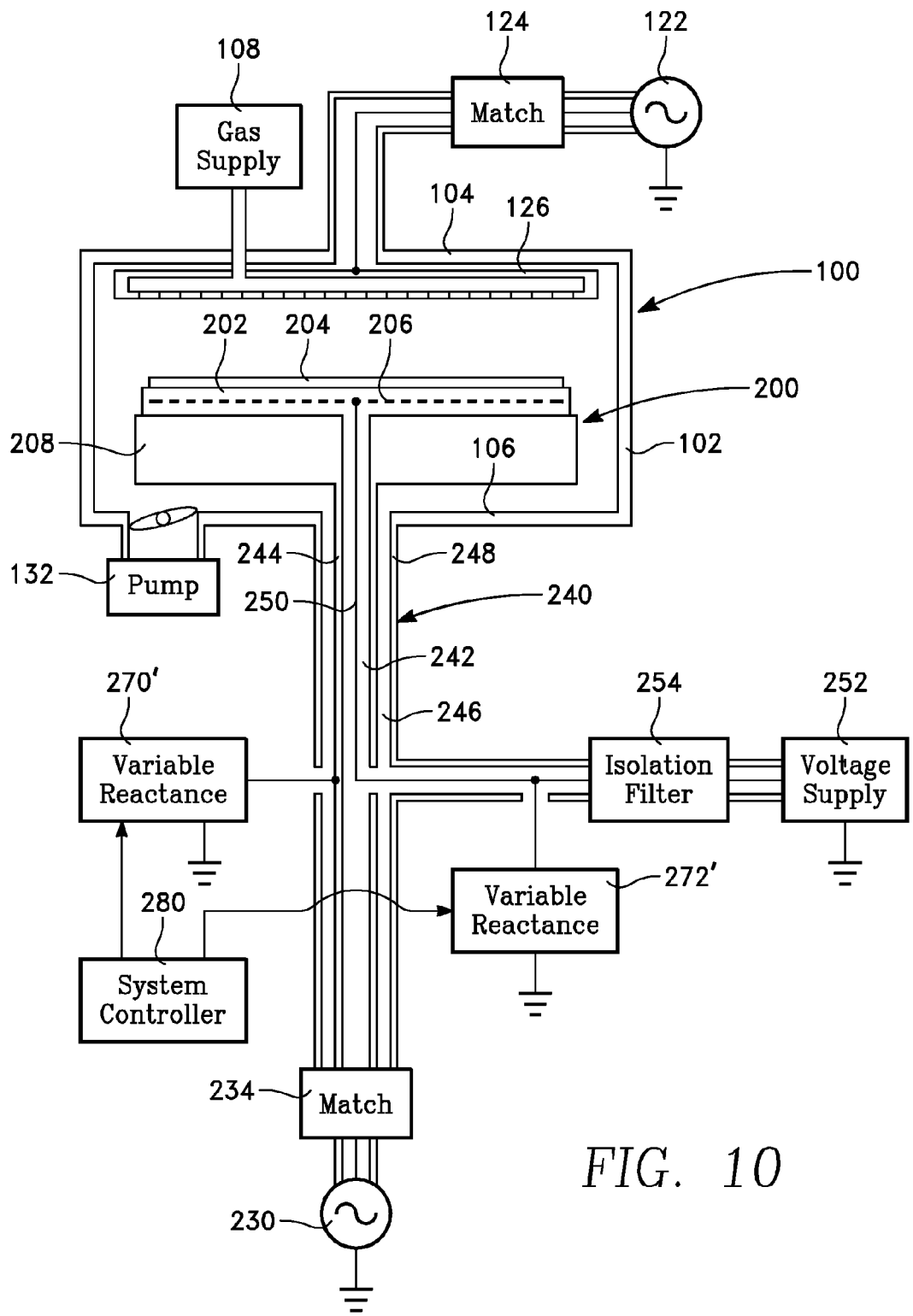
FIG. 10 is a simplified diagram of a related embodiment.

In FIGS. 7-9, the bottom end of the cathode feed conductor 244 is grounded. However, the cathode feed conductor 244 is not necessarily grounded, and FIG. 10 illustrates such a case. FIG. 10 depicts a modification that can be introduced into any of the embodiments of FIGS. 7-9, in which a RF bias power generator 230 is coupled through an RF bias impedance match circuit 234 to the cathode feed conductor 244 of the coaxial conductor assembly 240.

Each embodiment of FIGS. 7-9 has been described as having different counter electrodes corresponding to inner and outer zones. For example, in FIG. 7, the inner zone corresponds to an inner RF current path that extends from the ceiling electrode 126 to the ESC grid 206, through the coaxial conductor assembly 240 and through the variable reactance 272' to ground. The outer zone corresponds to an outer RF current path that extends from the ceiling electrode 126 to the cathode 208, through the coaxial conductor assembly 240 and through the variable reactance 270' to ground. The apportionment of current between the inner and outer RF current paths is affected by the impedances of the two paths. In FIG. 7, for example, the impedance of the inner RF current path is affected by a combination of the transmission line characteristics of the grid feed conductor 250 in the coaxial conductor assembly 240 and the reactance of the variable reactance 272'. The impedance of the outer RF current path is affected by a combination of the reactance of the variable reactance 270' and the RF transmission line characteristics of the cathode feed conductor 244 in the coaxial conductor assembly 240. The apportionment of currents between the inner and outer RF current paths is determined by the complex impedance of each path and the frequency of the RF power delivered by the RF generator 122. In FIG. 7, adjusting the variable reactances 270', 272' changes the current in each of the inner and outer paths relative to the other. For example, plasma ion density in each zone is increased (or decreased) relative to the other zone by increasing (or decreasing) the RF current in that zone relative to the other zone. In FIG. 8 a similar adjustment is made using the pair of variable reactances 272' and 273'. In FIG. 9 a similar adjustment is made using the pair of variable reactances 272-1 and 272-2.

Figures 11, 11A:
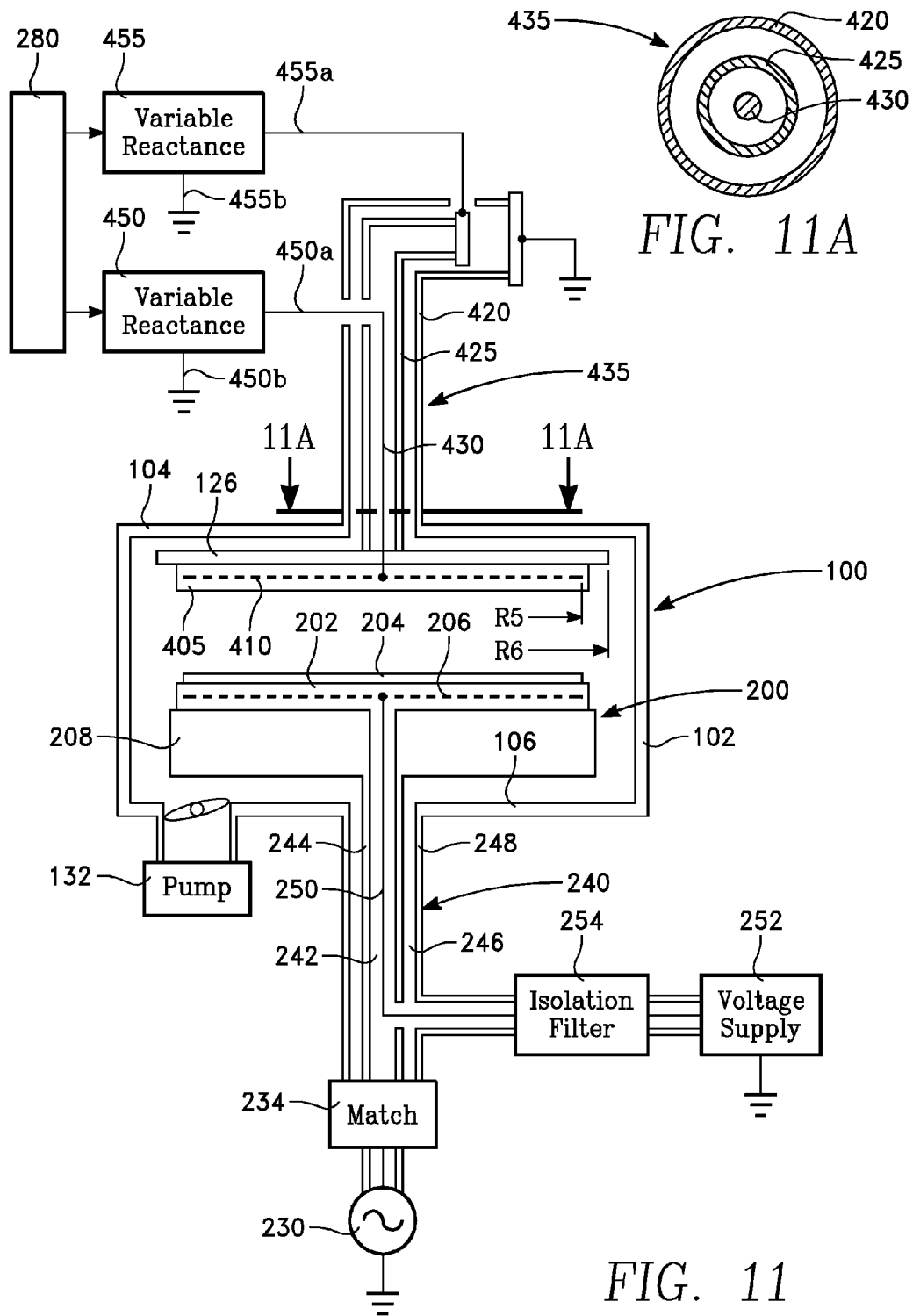
FIG. 11 is a simplified diagram of a yet further embodiment of the present invention.
FIG. 11A is a cross-sectional view taken along lines 11A-11A of FIG. 11.

FIGS. 11 and 11A depict an embodiment in which RF power applied to the cathode 208 is returned to ground via counter electrodes at the ceiling 104, the counter electrodes including the ceiling electrode 126 and a conductive mesh or grid 410 embedded in an insulating ceiling puck 405 mounted on the interior side of the ceiling electrode 126. In this embodiment, the cathode 208 is the RF-driven electrode. A grid conductor 430 extends upwardly from the grid 410 and out through (and above) the ceiling 104. An anode conductor 425 extends upwardly from the ceiling electrode 126 coaxially with the grid conductor 430. A ground conductor 420 extends upwardly from the side wall 102 coaxially with the anode conductor 425. The grid conductor 430, the anode conductor 425 and the ground conductor 420 together form a coaxial conductor assembly 435 shown in FIG. 11A that extends through and above the ceiling 104 to respective variable reactances.

A variable reactance 455 has one port 455a connected to the anode conductor 425 and an opposite port 455b connected directly to ground. Another variable reactance 450 has one port 450a connected to the grid conductor 430 and an opposite port 450b connected directly to ground. The system controller 280 governs the reactances of the variable reactances 450 and 455.

The grid 410 and the ceiling electrode 126 function as ground return electrodes (counter electrodes) for RF power coupled into the chamber 100 from the cathode 208. The grid 410 has a smaller radius R5 while the ceiling electrode 126 has a greater radius R6, so that the ceiling electrode 126 has a greater influence in an outer radial zone (e.g., from R5 to R6) while the grid 410 has a greater influence in an inner radial zone (e.g., within R5). By controlling the two variable reactances 450 and 455 differently, the difference or ratio between RF currents in the inner and outer zones is controlled to govern radial distribution of a plasma parameter, such as plasma ion density or plasma ion energy, for example. In the illustrated embodiment, the area of each counter electrode (i.e., the grid 410 and the ceiling electrode 126) correspond to respective planes that face and are parallel to a surface of the RF-driven electrode (the cathode 208).

Separate or differential control of the two variable reactances 450 and 455 controls the difference or ratio between RF current, voltage or power in the inner and outer zones, to govern radial distribution of a plasma parameter, such as plasma ion density or plasma ion energy, for example. One advantage is that this control can be exercised independently of chamber parameters such as chamber pressure, workpiece temperature, RF power levels, process gas flow distribution, process gas species, workpiece-to-ceiling gap, or the like. In one embodiment, the chamber parameters are set in accordance with a predetermined process recipe, and left unchanged while the radial distribution of a plasma parameter (such as plasma ion density or plasma ion energy) is adjusted or conformed to a desired distribution by varying the variable reactances 450 and 455. For example, the system controller 280 may set the chamber parameters such as chamber pressure, workpiece temperature, RF power levels, process gas flow distribution, process gas species, workpiece-to-ceiling gap, by fixing them to respective values specified in a process recipe. Then, without having to change any of the chamber parameter settings, the controller varies the variable reactances until the distribution of a plasma parameter (e.g., plasma ion density) reaches a desired distribution. The desired distribution may be a uniform distribution, for example.

Each of the variable reactances 450 and 455 may include one or more variable reactance elements, such as a variable capacitor, a variable inductor, a variable RF tuning stub, and the like, or combinations thereof. Such variable reactances are described below with reference to FIGS. 14A through 14D.

Figure 12:
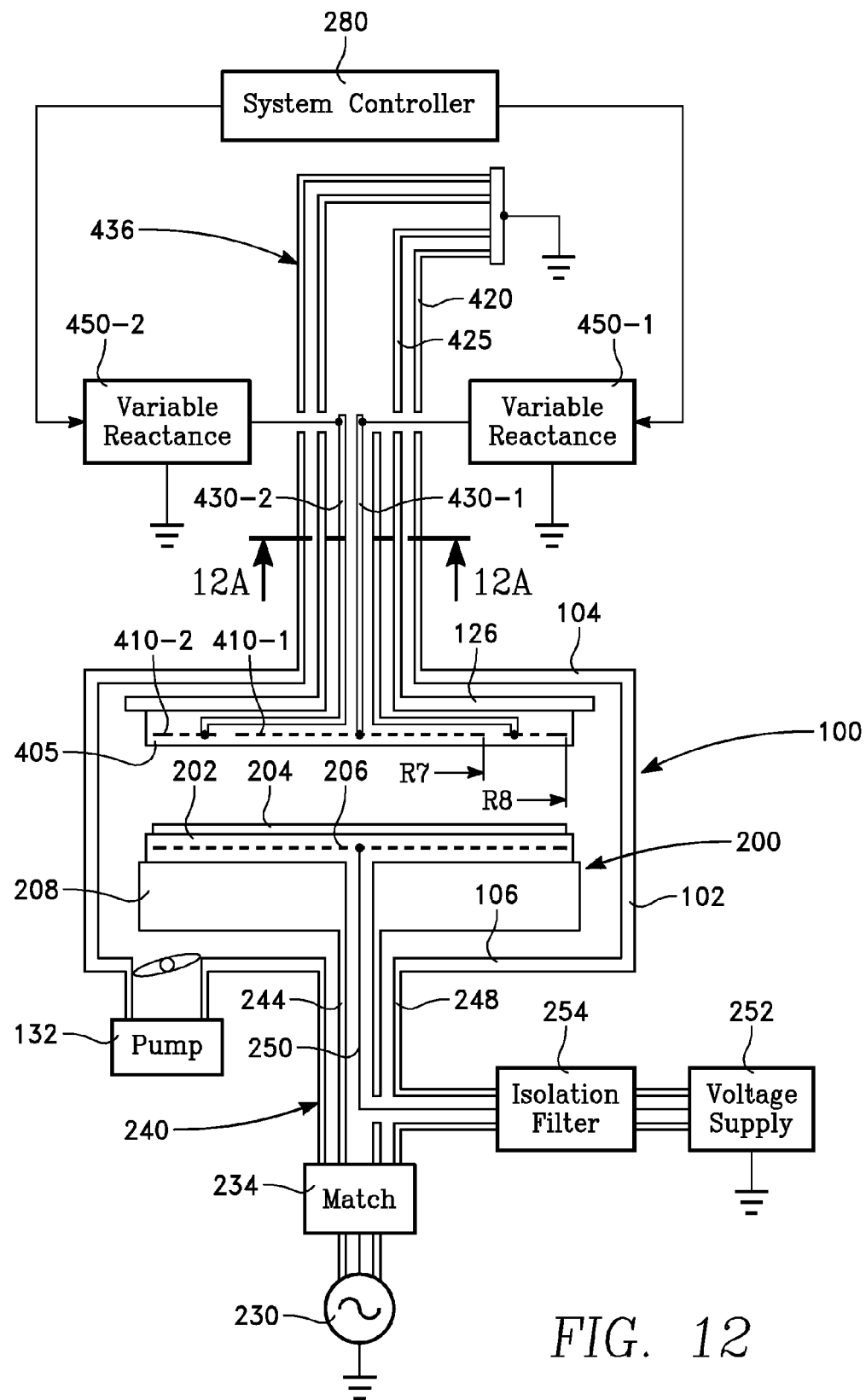
FIG. 12 is a simplified diagram of one embodiment of the present invention.
Figure 12A:
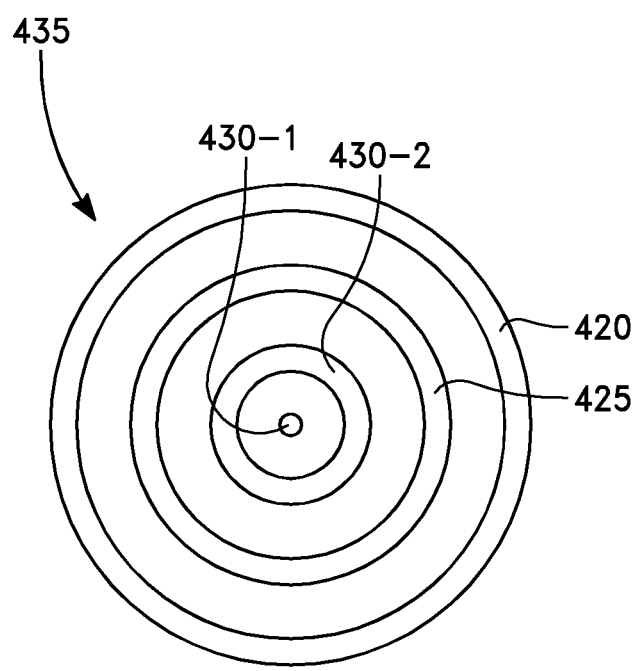
FIG. 12A is a cross-sectional view taken along lines 12A-12A of FIG. 12.

FIGS. 12 and 12A depict a modification in which the grid 410 is divided into radially inner and outer grids 410-1 and 410-2 electrically insulated or separate from one another. In one embodiments, the inner grid 410-1 is disk-shaped while the outer grid 410-2 is annular. Coaxial inner and outer grid conductors 430-1 and 430-2 in a coaxial conductor assembly 436 extend upwardly from respective ones of the inner and outer grids 410-1 and 410-2.

A variable reactance 450-1 has one port connected to the top end of the grid feed conductor 430-1 and an opposite port connected directly to ground. (As employed herein, the term "top end" refers to an end above the ceiling 104.) Another variable reactance 450-2 has one port connected to the top end of the outer grid conductor 430-2 and an opposite port connected directly to ground. The system controller 280 governs the reactances of the variable reactances 450-1 and 450-2.

The inner and outer grids 410-1 and 410-2 function as ground return electrodes (counter electrodes) for RF power coupled into the chamber 100 from the cathode 208 and the RF bias power generator 230. The inner grid 410-1 has a smaller radius R7 while the outer grid 410-2 has a greater radius R8, so that the outer grid 410-2 has a greater influence in an outer radial zone (e.g., from R7 to R8) while the inner grid 410-1 has a greater influence in an inner radial zone (e.g., within R7). By controlling the two variable reactances 410-1 and 410-2 differently, the difference or ratio between RF currents (or voltages or power levels) in the inner and outer zones is controlled to govern radial distribution of a plasma parameter, such as plasma ion density or plasma ion energy, for example.

Figure 13:
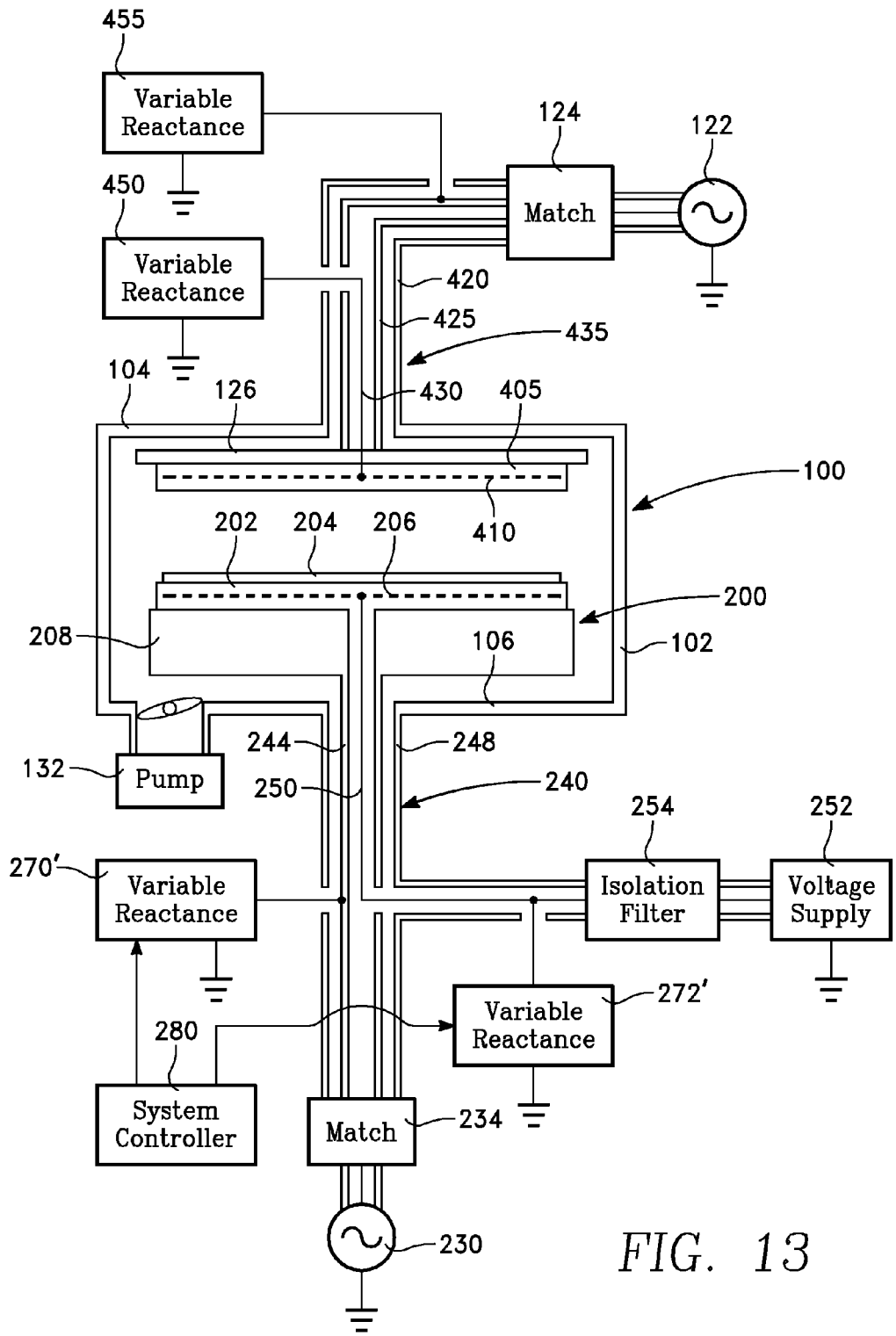
FIG. 13 is a simplified diagram of an embodiment combining features of the embodiments of FIGS. 7 and 11.

FIG. 13 depicts an example of an embodiment in which RF power at one frequency is applied to the ceiling electrode 126 and returned to ground through different counter electrodes at the workpiece support pedestal 200, while RF power at another frequency is applied to the workpiece support pedestal 200 and returned to ground through different counter electrodes at the ceiling 104. In the example of FIG. 13, the features of FIGS. 7 and 11 are combined, and like components in FIG. 13 have the same reference numerals as corresponding components in FIGS. 7 and 11. In FIG. 13, the variable reactances 270' and 272' are tuned to provide very high impedances at the frequency of the RF power generator 230 while providing lower impedances at the frequency of the RF power generator 122. Similarly, the variable reactances 450 and 455 are tuned to provide very high impedances at the frequency of RF power generator 122 while providing lower impedances at the frequency of the RF bias power generator 230.

In one implementation of FIG. 13, the RF power generator 122 near the ceiling 104 has a sufficiently high frequency (e.g., a VHF frequency) to contribute primarily to plasma ion generation, while the RF bias power generator 230 near the workpiece support pedestal 200 has a sufficiently low frequency (e.g., within the HF, MF or LF frequency ranges) to contribute primarily to plasma ion energy. In such a case, tuning of the variable reactances 270' and 272' primarily affects radial distribution of plasma ion density while tuning of the variable reactances 450 and 455 primarily affects radial distribution of plasma ion energy.

In another implementation of FIG. 13, the reverse is carried out, in that the RF power generator 122 near the ceiling 104 has a sufficiently low high frequency to contribute primarily to plasma ion energy, while the RF bias power generator 230 near the workpiece support pedestal 200 has a sufficiently high frequency to contribute primarily to plasma ion generation. In such a case, tuning of the variable reactances 270' and 272' primarily affects radial distribution of plasma ion energy while tuning of the variable reactances 450 and 455 primarily affects radial distribution of plasma ion density.

Figures 14A, 14B:
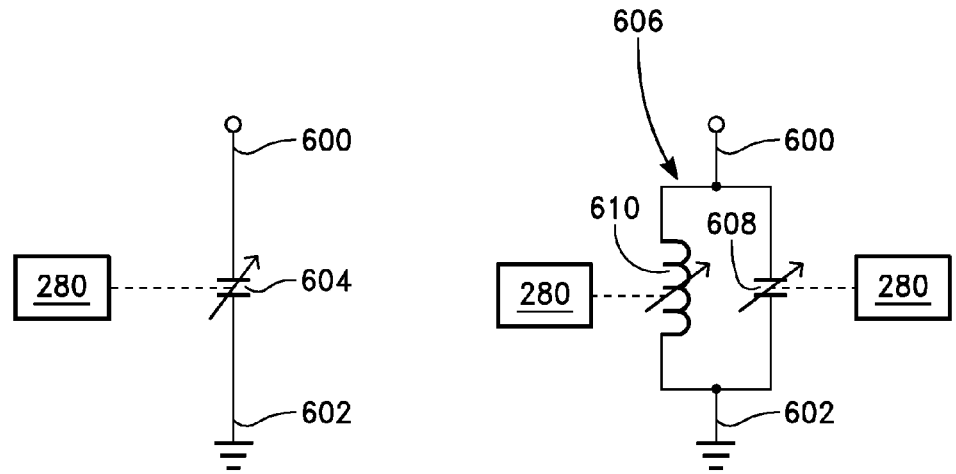
FIGS. 14A, 14B, 14C and 14D depict different embodiments of a variable reactance that can be employed in the embodiments of FIGS. 7-13.
Figures 14C, 14D:
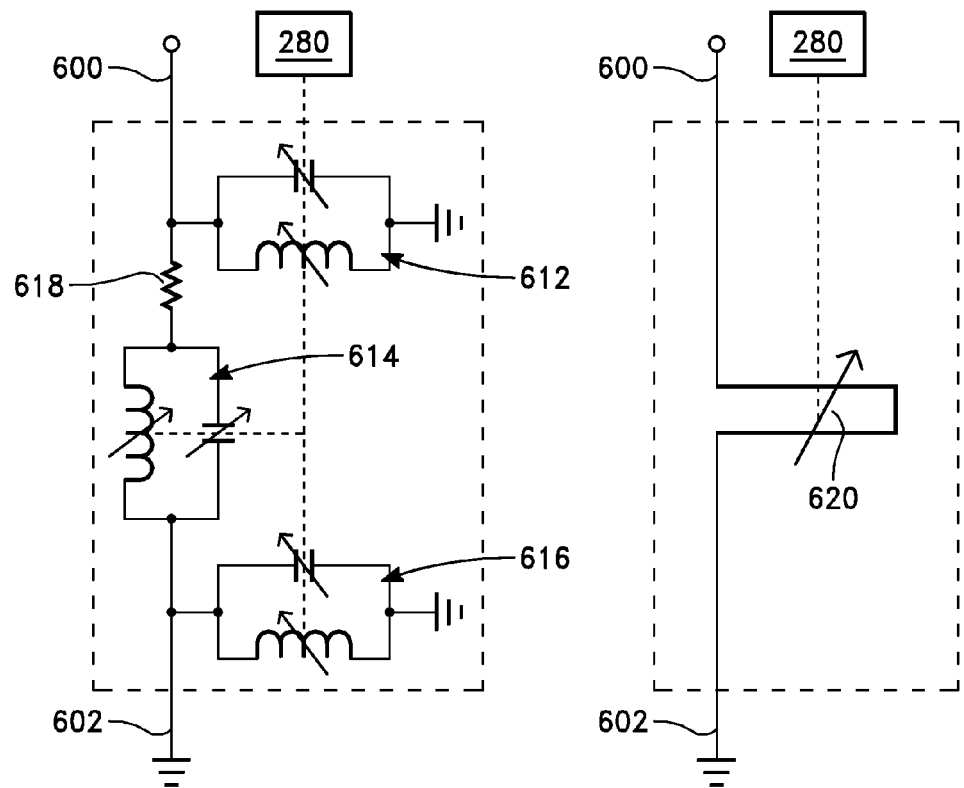

In the embodiments of FIGS. 7-13, each of the variable reactances 270', 272', 273', 272-1, 272-2, 450, 455, 450-1 and 450-2 may be implemented in accordance with any suitable embodiments including, but not limited to, embodiments of FIGS. 14A-14D. In FIGS. 14A-14D, each embodiment has a first port or terminal 600 connected to the counter electrode to be tuned, and a second port or terminal 602 connected to ground. The variable reactance of FIG. 14A is a variable capacitor 604 governed by the system controller 280. The variable capacitor 604 may be replaced by a variable inductor (not shown). The variable reactance of FIG. 14B is an LC tank circuit 606 which is a combination of a capacitor 608 and an inductor 610 in parallel with one another, either or both of which may be variable and governed by the system controller 280. The variable reactance of FIG. 14C includes plural LC tank circuits including a first shunt LC tank circuit 612 connected to the terminal 600, a series LC tank circuit 614 and a second shunt LC tank circuit 616. A series resistor 618 is connected between the series LC tank circuit 614 and the terminal 600. In each of the tank circuits 612, 614 and 616, any or all of the capacitors or inductors may be variable and controlled by the system controller 280. The variable reactance of FIG. 14D includes a variable tuning stub 620 which may have a nominal electrical length of a quarter wavelength at the frequency of the RF current conducted through the variable reactance. The variable tuning stub 620 may be governed by the system controller 280.

While the foregoing is directed to embodiments of the present invention, other and further embodiments of the invention may be devised without departing from the basic scope thereof, and the scope thereof is determined by the claims that follow.

What is claimed is:

1. In a plasma reactor chamber, a method of controlling distribution of a plasma parameter, comprising:

applying RF power to a power applicator electrode adjacent a first side of said plasma reactor chamber;

providing inner and outer counter electrodes facing said power applicator electrode near a second side of said plasma reactor chamber opposite said first side, said outer counter electrode having a radial extent exceeding that of said inner counter electrode;

providing a first variable reactance connected between said inner counter electrode and ground, and a second variable reactance connected between said outer counter electrode and ground; and controlling distribution of a plasma parameter in a processing region of said plasma reactor chamber by separately controlling said first and second variable reactances.

2. The method of claim 1 wherein said plasma parameter comprises one of plasma ion density or plasma ion energy.

3. The method of claim 1 wherein said controlling distribution of a plasma parameter is preceded by setting chamber parameters in said plasma reactor chamber in accordance with a process recipe, said chamber parameters comprising at least one of chamber pressure, process gas flow rate, RF power level, ceiling-to-workpiece gap, workpiece temperature.

4. The method of claim 3 wherein said controlling distribution of a plasma parameter comprises conforming said distribution to a predetermined distribution without changing said chamber parameters.

5. The method of claim 1 wherein said controlling distribution of a plasma parameter comprises varying said second variable reactance until current flow to said outer counter electrode reaches a peak, and then varying said first variable reactance so as to more closely conform said distribution of said plasma parameter with a predetermined distribution.

6. The method of claim 1 further comprising coupling said inner counter electrode to said first variable reactance through an inner cylindrical conductor and coupling said outer counter electrode to said second variable reactance through an outer cylindrical conductor coaxial with said inner cylindrical conductor.

7. The method of claim 6 wherein said inner and outer cylindrical conductors are comprised within a coaxial conductor assembly, said method further comprising extending said coaxial conductor assembly through a containment element of said plasma reactor chamber.

8. The method of claim 7 wherein said containment element comprises one of a ceiling or a floor of said plasma reactor chamber.

9. In a plasma reactor chamber, a method of controlling distribution of a plasma parameter, comprising:

applying RF power to a power applicator electrode adjacent a first side of said plasma reactor chamber;

providing plural counter electrodes facing said power applicator electrode near a second side of said plasma reactor chamber opposite said first side, said plural counter electrodes being coextensive with plural annular process zones, respectively, of said plasma reactor chamber;

providing plural variable reactances connected between ground and respective ones of said plural counter electrodes; and controlling distribution of a plasma parameter in a processing region of said plasma reactor chamber by separately controlling said plural variable reactances.

10. The method of claim 9 wherein said plasma parameter comprises one of plasma ion density or plasma ion energy.

11. The method of claim 9 wherein said controlling distribution of a plasma parameter is preceded by setting chamber parameters in said plasma reactor chamber in accordance with a process recipe, said chamber parameters comprising at least one of chamber pressure, process gas flow rate, RF power level, ceiling-to-workpiece gap, workpiece temperature.

12. The method of claim 11 wherein said controlling distribution of a plasma parameter comprises conforming said distribution to a predetermined distribution without changing said chamber parameters.

13. The method of claim 9 wherein said controlling distribution of a plasma parameter comprises varying said second variable reactance until current flow to said outer counter electrode reaches a peak, and then varying said first variable reactance so as to more closely conform said distribution of said plasma parameter with a predetermined distribution.

14. The method of claim 9 further comprising coupling said inner counter electrode to said first variable reactance through an inner cylindrical conductor and coupling said outer counter electrode to said second variable reactance through an outer cylindrical conductor coaxial with said inner cylindrical conductor.

15. The method of claim 14 wherein said inner and outer cylindrical conductors are comprised within a coaxial conductor assembly, said method further comprising extending said coaxial conductor assembly through a containment element of said plasma reactor chamber.

16. The method of claim 15 wherein said containment element comprises one of a ceiling or a floor of said plasma reactor chamber.

17. The method of claim 9 further comprising:

applying a second RF power to a second power applicator electrode adjacent said second side of said plasma reactor chamber;

providing a second plural counter electrodes facing said second power applicator electrode near said first side of said plasma reactor chamber, said second plural counter electrodes being coextensive with plural annular process zones, respectively, of said plasma reactor chamber;

providing second plural variable reactances connected between ground and respective ones of said second plural counter electrodes; and controlling distribution of a second plasma parameter in a processing region of said plasma reactor chamber by separately controlling said second plural variable reactances.

18. The method of claim 17 wherein said RF power has a first frequency and said second RF power has a second frequency exceeding said first frequency, and wherein said plasma parameter comprises plasma ion energy and said second plasma parameter comprises plasma ion density.

19. The method of claim 18 wherein said second frequency is in a VHF range and said first frequency is below said VHF range.

* * * * *